(12) United States Patent
Eid et al.

(10) Patent No.: US 11,688,665 B2
(45) Date of Patent: Jun. 27, 2023

(54) THERMAL MANAGEMENT SOLUTIONS FOR STACKED INTEGRATED CIRCUIT DEVICES

(71) Applicant: Intel Corporation, Santa Clara, CA (US)

(72) Inventors: Feras Eid, Chandler, AZ (US); Adel Elsherbini, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 993 days.

(21) Appl. No.: 16/007,269

(22) Filed: Jun. 13, 2018

(65) Prior Publication Data

US 2019/0385933 A1 Dec. 19, 2019

(51) Int. Cl.
*H01L 23/31* (2006.01)
*H01L 23/367* (2006.01)
(Continued)

(52) U.S. Cl.
CPC ........ *H01L 23/473* (2013.01); *H01L 23/3157* (2013.01); *H01L 23/3677* (2013.01); *H01L 23/467* (2013.01); *H01L 23/49822* (2013.01); *H01L 23/5386* (2013.01); *H01L 25/0655* (2013.01); *H01L 25/0657* (2013.01);
(Continued)

(58) Field of Classification Search
CPC ............. H01L 23/3157; H01L 23/3677; H01L 23/467; H01L 23/473; H01L 23/49822; H01L 23/5386; H01L 25/0655; H01L 25/0657

See application file for complete search history.

(56) References Cited

U.S. PATENT DOCUMENTS

| 5,313,366 A | 5/1994 | Gaudenzi et al. |
| 5,768,103 A | 6/1998 | Kobrinetz et al. |

(Continued)

FOREIGN PATENT DOCUMENTS

KR 20130059147 6/2013

OTHER PUBLICATIONS

International Search Report and Written Opinion for PCT Application No. PCT/US19/31249, dated Aug. 28, 2019, 11 pgs.
(Continued)

*Primary Examiner* — Herve-Louis Y Assouman
*Assistant Examiner* — Christopher M Roland
(74) *Attorney, Agent, or Firm* — Essential Patents Group, LLP

(57) ABSTRACT

An integrated circuit assembly may be formed having a substrate, a first integrated circuit device electrically attached to the substrate, a second integrated circuit device electrically attached to the first integrated circuit device, and a heat dissipation device defining a fluid chamber, wherein at least a portion of the first integrated circuit device and at least a portion of the second integrated circuit device are exposed to the fluid chamber. In further embodiments, at least one channel may be formed in an underfill material between the first integrated circuit device and the second integrated circuit device, between the first integrated circuit device and the substrate, and/or between the second integrated circuit device and the substrate, wherein the at least one channel is open to the fluid chamber.

17 Claims, 14 Drawing Sheets

(51) Int. Cl.
    *H01L 23/488*     (2006.01)
    *H01L 23/46*     (2006.01)
    *H01L 23/473*     (2006.01)
    *H01L 25/065*     (2023.01)
    *H01L 23/498*     (2006.01)
    *H01L 23/467*     (2006.01)
    *H01L 23/538*     (2006.01)

(52) U.S. Cl.
    CPC ............ *H01L 2225/06513* (2013.01); *H01L 2225/06517* (2013.01); *H01L 2225/06589* (2013.01)

(56) References Cited

U.S. PATENT DOCUMENTS

| | | | |
|---|---|---|---|
| 6,535,388 B1 | 3/2003 | Garcia | |
| 6,717,812 B1 | 4/2004 | Pinjala et al. | |
| 7,078,803 B2 | 7/2006 | Tilton et al. | |
| 7,206,203 B2 | 4/2007 | Campbell et al. | |
| 7,990,711 B1 | 8/2011 | Andry et al. | |
| 2005/0168947 A1 | 8/2005 | Mok et al. | |
| 2006/0250773 A1 | 11/2006 | Campbell et al. | |
| 2008/0067651 A1 | 3/2008 | Goth et al. | |
| 2008/0116568 A1 | 5/2008 | Laquer et al. | |
| 2009/0057881 A1* | 3/2009 | Arana | H01L 25/0657 257/714 |
| 2009/0108435 A1* | 4/2009 | Bernstein | H01L 25/0657 257/691 |
| 2009/0316360 A1 | 12/2009 | Campbell et al. | |
| 2010/0230805 A1 | 9/2010 | Refai-Ahmed | |
| 2010/0290188 A1 | 11/2010 | Brunschwiler et al. | |
| 2013/0134571 A1 | 5/2013 | Kim et al. | |
| 2014/0015119 A1 | 1/2014 | Bonkohara | |
| 2014/0254099 A1 | 9/2014 | Takeda | |
| 2014/0374896 A1 | 12/2014 | Nishida et al. | |
| 2015/0221613 A1* | 8/2015 | Andry | H01L 25/0657 257/770 |
| 2016/0007499 A1 | 1/2016 | Song et al. | |
| 2016/0056089 A1 | 2/2016 | Taniguchi et al. | |
| 2016/0071818 A1* | 3/2016 | Wang | H01L 24/89 257/774 |
| 2016/0190034 A1 | 6/2016 | Okamotoa | |
| 2017/0148767 A1 | 5/2017 | Hung et al. | |
| 2017/0179001 A1 | 6/2017 | Brunschwiler et al. | |
| 2017/0229409 A1* | 8/2017 | Hu | H01L 25/0655 |
| 2017/0243806 A1 | 8/2017 | Iyengar et al. | |
| 2018/0076113 A1 | 3/2018 | Brunschwiler et al. | |
| 2019/0385931 A1* | 12/2019 | Eid | H01L 23/49822 |
| 2019/0385932 A1* | 12/2019 | Eid | H01L 24/32 |
| 2021/0305132 A1* | 9/2021 | Karhade | H01L 23/5385 |

OTHER PUBLICATIONS

International Preliminary Report on Patentability for PCT Application No. PCT/US2019/031249, dated Dec. 24, 2020.
Office Action for U.S. Appl. No. 16/007,255, dated Nov. 19, 2021.
Restriction Requirement for U.S. Appl. No. 16/007,255, dated Sep. 8, 2021.
Restriction Requirement for U.S. Appl. No. 16/007,260, dated Sep. 17, 2021.
Office Action for U.S. Appl. No. 16/007,260, dated Jan. 5, 2022.
Final Office Action for U.S. Appl. No. 16/007,255, dated Jun. 22, 2022.
Notice of Allowance for U.S. Appl. No. 16/007,260, dated Jun. 29, 2022.

* cited by examiner

THERMAL MANAGEMENT SOLUTIONS FOR STACKED INTEGRATED CIRCUIT DEVICES

TECHNICAL FIELD

Embodiments of the present description generally relate to the removal of heat from integrated circuit devices, and, more particularly, to thermal management solutions wherein a heat transfer fluid of a heat dissipation device is in physical contact with stacked integrated circuit devices within an integrated circuit device package.

BACKGROUND

Higher performance, lower cost, increased miniaturization, and greater packaging density of integrated circuits within integrated circuit devices are ongoing goals of the electronics industry. As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. This issue becomes even more critical when multiple integrated circuit devices are incorporated in a stacked configuration. As will be understood to those skilled in the art, when multiple integrated circuit devices are stacked, some of the integrated circuit devices will be "internally" positioned between an adjacent integrated circuit device and a substrate to which the stacked integrated circuit devices are attached or will be positioned between a pair of adjacent integrated circuit devices. As such, these internally positioned integrated circuit devices are isolated from thermal management solutions, such as heat spreaders, since the integrated circuit devices and/or the substrate to which the integrated circuit devices may be adjacent, are generally not efficient thermal conductors, nor are the various intervening layers, such as thermal interface material layers, underfill materials, and the like, which are between the internally positioned integrated circuit device and the thermal management solutions. This problem is exacerbated by thermal cross talk between the stacked integrated circuit devices and potential superposition of the hot spots due to the stacking, as will be understood to those skilled in the art. Thus, the internally positioned integrated circuit devices may exceed their temperature limits, which may require throttling (speed reduction of the integrated circuit devices) that can lead to reduced performance, or, in extreme cases, can lead to damage and failure of the entire integrated circuit package.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
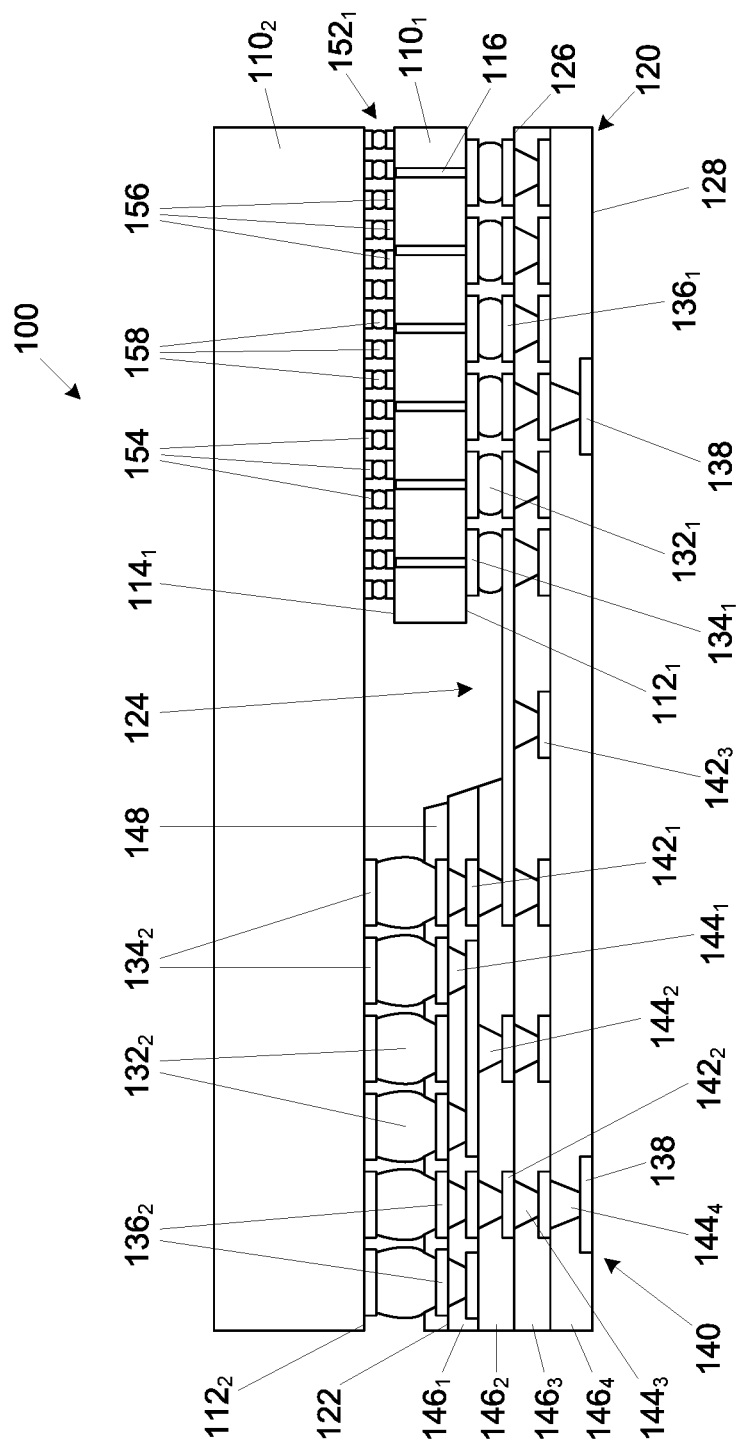
FIG. 1 is a side cross-sectional view of an integrated circuit stacked structure, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more integrated circuit devices by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit assembly having a substrate, a first integrated circuit device electrically attached to the substrate, a second integrated circuit device electrically attached to the first integrated circuit device, and a heat dissipation device defining a fluid chamber, wherein at least a portion of the first integrated circuit device and at least a portion of the second integrated circuit device are exposed to the fluid chamber, such that when a heat transfer fluid is introduced into the fluid chamber, the heat transfer fluid makes direct contact with the first integrated circuit device and the second integrated circuit device. In further embodiments, at least one channel may be formed in an underfill material between the first integrated circuit device and the second integrated circuit device, between the first integrated circuit device and the substrate, and/or between the second integrated circuit device and the substrate, wherein the at least one channel is open to the fluid chamber.

In the production of integrated circuit packages, integrated circuit devices are generally mounted on substrates, which provide electrical communication routes between the integrated circuit devices and/or with external components. As shown in FIG. 1, an integrated circuit stacked structure 100 may comprise a plurality of integrated circuit devices (illustrated as first integrated circuit device $110_1$, and second integrated circuit device $110_2$), such as microprocessors, chipsets, graphics devices, wireless devices, memory devices, application specific integrated circuits, combinations thereof, stacks thereof, or the like, attached to a substrate 120, such as an interposer, a printed circuit board, a motherboard, and the like. As illustrated, the substrate 120 may include a recess 124 formed to extend into the substrate 120 from a first surface 122 (also known as the "die side") thereof and the first integrated circuit device $110_1$ may be at least partially disposed in the recess 124. The first integrated circuit device $110_1$ may be electrically attached to the substrate 120 within the recess 124 through a first plurality of device-to-substrate interconnects $132_1$, such as reflowable solder bumps or balls, in a configuration generally known as a flip-chip or controlled collapse chip connection ("C4") configuration. The first plurality of device-to-substrate interconnects $132_1$ may extend from bond pads $134_1$ on a first surface $112_1$ of the first integrated circuit device $110_1$ and bond pads $136_1$ on a bottom surface 126 of the recess 124 of the substrate 120. The integrated circuit device bond pads $134_1$ of first integrated circuit device $110_1$ may be in electrical communication with circuitry (not shown) within the first integrated circuit device $110_1$, such as with through-silicon vias 116.

As further shown in FIG. 1, the second integrated circuit device $110_2$ may be attached to a first surface 122 of the substrate 120 through a second plurality of device-to-substrate interconnects $132_2$, such as reflowable solder bumps or balls. The second plurality of device-to-substrate interconnects $132_2$ may extend from bond pads $134_2$ on a first surface $112_2$ of the second integrated circuit device $110_2$ and bond pads $136_2$ on the first surface 122 of the substrate 120. A solder resist material 148 may also be patterned on the first surface 122 of the substrate 120 to assist in the containment and attachment of the second plurality of device-to-substrate interconnects $132_2$. The bond pads $134_2$ of the second integrated circuit device $110_2$ may be in electrical communication with circuitry (not shown) within the second integrated circuit device $110_2$. The substrate 120 may include at least one conductive route 140 extending therethrough or thereon to form electrical connections between the first integrated circuit device $110_1$ and the second integrated circuit device $110_2$ and/or from the integrated circuit devices $110_1$, $110_2$ to external components (not shown).

The first integrated circuit device $110_1$ and the second integrated circuit device $110_2$ may be electrically attached to one another through a first plurality of high-density device-to-device interconnects $152_1$. As used herein, the term "high density" is relative to the device-to-substrate interconnects $132_1$ and $132_2$, which have a greater pitch than the first plurality of high-density device-to-device interconnects $152_1$. In some embodiments, the first plurality of high density device-to-device interconnects $152_1$ may be fabricated using a modified semi-additive process or a semi-additive build-up process with advanced lithography (with small vertical interconnect features formed by advanced laser or lithography processes), as will be understood to those skilled in the art, while the device-to-substrate interconnects $132_1$ and $132_2$ may be fabricated using a lower density process, such as a standard subtractive process using etch chemistry to remove areas of unwanted conductive material and forming coarse vertical interconnect features by a standard laser process. The first plurality of high-density device-to-device interconnects $152_1$ may comprise high-density bond pads 154 on the first surface $112_2$ of the second integrated circuit device $110_2$ and high-density bond pads 156 on a second surface $114_1$ of the first integrated circuit device $110_1$ with solder balls 158 extending therebetween.

The substrate 120 may be primarily composed of an appropriate dielectric material, including, but not limited to, bismaleimide triazine (BT) resin, fire retardant grade 4 (FR-4) material, polyimide materials, glass reinforced epoxy matrix material, low-k and ultra low-k dielectrics (e.g. carbon-doped dielectrics, fluorine-doped dielectrics, porous dielectrics, and organic polymeric dielectric), and the like, as well as laminates or multiple layers thereof. The substrate conductive routes 140, also known as metallization, may be composed of any conductive material, including but not limited to metals, such as copper, silver, gold, nickel, and aluminum, and alloys thereof. As will be understood to those skilled in the art, the substrate conductive routes 140 may be formed as a plurality of conductive traces $142_1$, $142_2$, and $142_3$ formed on layers of dielectric material $146_1$, $146_2$, $146_3$, $146_4$, which are electrically connected by conductive vias $144_1$, $144_2$, $144_3$, $144_4$. Furthermore, the substrate 120 may be either a cored or a coreless substrate.

In an embodiment of the present description, one or more of the conductive routes 140 in the substrate 120 may extend between the bond pads $136_2$ at the first surface 122 of the substrate 120 and external connection bond pads 138 at a second surface 128 of the substrate 120. In an embodiment of the present description, one or more of the conductive routes 140 in the substrate 120 may extend between bond pads $136_1$ at the bottom surface 126 of the recess 124 and external connection bond pads 138 at the second surface 128 of the substrate 120. In some embodiments, one or more of the conductive routes 140 in the substrate 120 may extend between bond pads $136_2$ at the first surface 122 of the substrate 120 and bond pads $136_1$ at the bottom surface 126 of the recess 124.

The device-to-substrate interconnects $132_1$, $132_2$ and the first plurality of high-density device-to-device interconnects $152_1$ can be made of any appropriate material, including, but not limited to, solders materials. The solder materials may be any appropriate material, including, but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. When the first integrated circuit device $110_1$ is attached to the substrate 120 with device-to-substrate interconnects $132_1$ made of solder, when the second integrated circuit device $110_2$ is attached to the substrate 120 with device-to-substrate interconnects $132_2$ made of solder, and/or when the second integrated circuit device $110_2$ is attached to the first integrated circuit device $110_1$ with the first plurality of high density device-to-device interconnects $152_1$ made of solder, the solder is reflowed, either by heat, pressure, and/or sonic energy to secure the solder therebetween.

Figure 2:
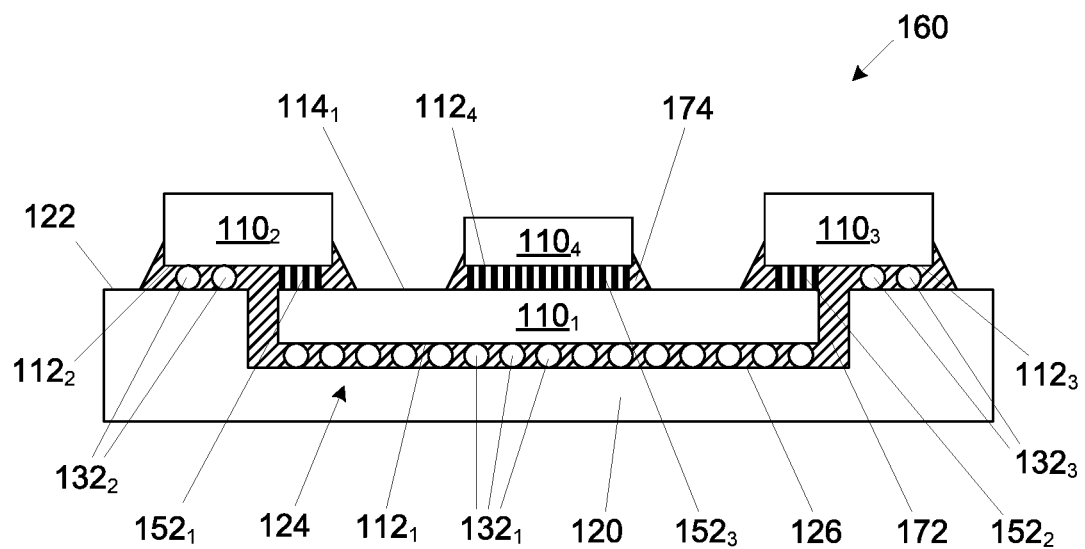
FIG. 2 is a side cross-sectional view of an electronic assembly having stacked integrated circuit devices, according to an embodiment of the present description.

FIG. 2 illustrates an electronic assembly having stacked integrated circuit devices. As shown in FIG. 2, the structure of FIG. 1 may be formed within an electronic assembly 160. The electronic assembly 160 may further include additional integrated circuit devices, i.e. a third integrated circuit device $110_3$ and a fourth integrated circuit device $110_4$. In one embodiment, as discussed with regard to the second integrated circuit device $110_2$, the third integrated circuit device $110_3$ may be attached to the first surface 122 of the substrate 120 through a third plurality of device-to-substrate interconnects $132_3$, such as reflowable solder bumps or balls. The third plurality of device-to-substrate interconnects $132_3$ may extend from bond pads (not shown) on a first surface $112_3$ of the third integrated circuit device $110_3$ and bond pads (not shown) on the first surface 122 of the substrate 120. The bond pads (not shown) of the third integrated circuit device $110_3$ may be in electrical communication with circuitry (not shown) within the third integrated circuit device $110_3$. The first integrated circuit device $110_1$ and the third integrated circuit device $110_3$ may be electrically attached to one another through a second plurality of high-density interconnects $152_2$, in the manner previously discussed. In a further embodiment of the present description, a first surface $112_4$ of the fourth integrated circuit device $110_4$ may be attached to the second surface $114_1$ of the first integrated circuit device $110_1$ through a third plurality of high-density interconnects $152_3$.

It is further understood that a first underfill material 172, such as an epoxy material, may be disposed between the first surface $112_1$ of the first integrated circuit device $110_1$ and the bottom surface 126 of the recess 124 of the substrate 120 and surround the first plurality of device-to-substrate interconnects $132_1$. The first underfill material 172 is further disposed between the first surface $112_2$ of the second integrated circuit device $110_2$ and the first surface 122 of the substrate 120 to surround the second plurality of device-to-substrate interconnects $132_2$ and disposed between the first surface $112_2$ of the second integrated circuit $110_2$ and at least a portion of the second surface $114_1$ of first integrated circuit device $110_1$ to surround the first plurality of high-density interconnects $152_1$. The first underfill material 172 is still further disposed between the first surface $112_3$ of the third integrated circuit device $110_3$ and the first surface 122 of the substrate 120 to surround the second plurality of device-to-substrate interconnects $132_3$ and disposed between the first surface $112_3$ of the third integrated circuit $110_3$ and at least a portion of the second surface $114_1$ of the first integrated circuit device $110_1$ to surround the second plurality of high-density interconnects $152_2$. A second underfill material 174, such as an epoxy material, may be disposed between the second surface $114_1$ of the first integrated circuit device $110_1$ and the first surface $112_4$ of the fourth integrated circuit device $110_4$ to surround the third plurality of high-density interconnects $152_3$. The first underfill material 172 and the second underfill material 174 may provide structural integrity and may prevent contamination, as will be understood to those skilled in the art.

It is understood that the electronic assembly 160 of FIG. 2 may have any appropriate number of integrated circuit devices (e.g. elements $110_1$-$110_4$) in any appropriate arrangement. For example, FIGS. 3-8 are top views of exemplary arrangements of a plurality of integrated circuit devices in various electronic assemblies 160, in accordance with embodiments of the present description, and which may be referred to as omni-directional interconnect (ODI) integration schemes. For the purpose of clarity, the substrate 120 has not been illustrated in FIGS. 3-8. However, it is understood that in some embodiment at least one of the plurality of integrated circuit devices 110A, 110B, 110C may be at least partially disposed in one or more recesses 124 in the substrate 120 (such as shown in FIG. 2). In other embodiments, none of the plurality of integrated circuit devices 110A, 110B, 110C may be disposed in one or more recesses 124 in the substrate 120 (such as shown in FIG. 2). In the arrangements shown in FIGS. 3-8, the integrated circuit devices 110A, 110B, 110C may include any suitable circuitry. For example, in some embodiments, the integrated circuit device 110A may be an active or passive die, and the integrated circuit devices 110B may include input/output circuitry, high bandwidth memory, and/or enhanced dynamic random-access memory (EDRAM).

Figure 3:
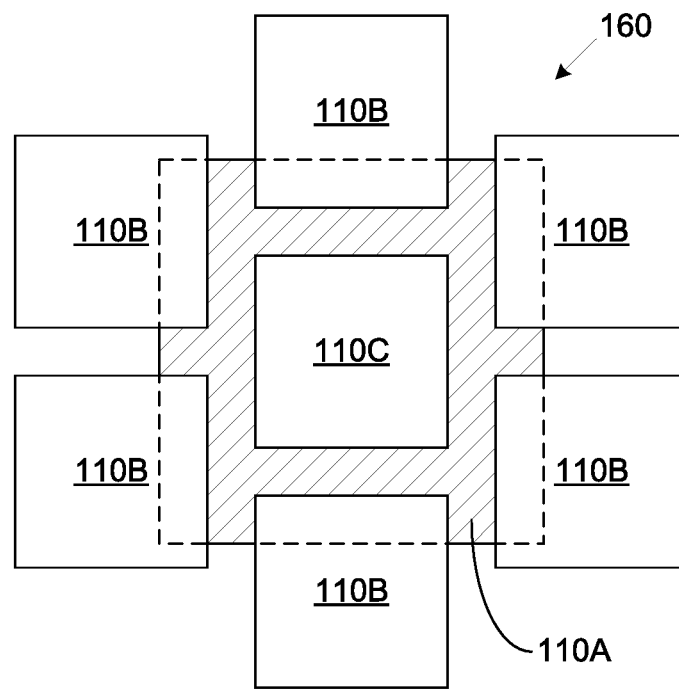
FIGS. 3-8 are top plan views of exemplary arrangements of a plurality of integrated circuit devices in various electronic assemblies, according to various embodiments of the present description.

As shown in FIG. 3, at least one integrated circuit device 110A may be positioned below a plurality of integrated circuit devices (illustrated as edge integrated circuit devices 110B and central integrated circuit device 110C). The integrated circuit device 110A may act as a bridging device and may be connected to the substrate 120 (not shown for clarity—see FIG. 2) in any manner previously disclosed herein with reference to the integrated circuit device $110_1$. The integrated circuit devices 110B may span the substrate 120 (see FIG. 2) and span at least a portion of the integrated circuit device 110A (e.g., in any manner disclosed herein with reference to the integrated circuit devices $110_2$ and $110_3$ of FIG. 2). FIG. 3 also illustrates an integrated circuit device 110C disposed on the integrated circuit device 110A (e.g., in the manner disclosed herein with reference to the integrated circuit device $110_3$ of FIG. 2). In FIG. 3, the integrated circuit devices 110B may "overlap" the edges and/or the corners of the integrated circuit device 110A, while the integrated circuit device 110C may be entirely above the integrated circuit device 110A. Placing the integrated circuit devices 110B at least partially over the corners of the integrated circuit device 110A may reduce routing congestion in the integrated circuit device 110A and may improve utilization of the integrated circuit device 110A (e.g., in case the number of input/outputs needed between the integrated circuit device 110A and the integrated circuit devices 110B is not large enough to require the full edge of the integrated circuit device 110A).

Figure 4:
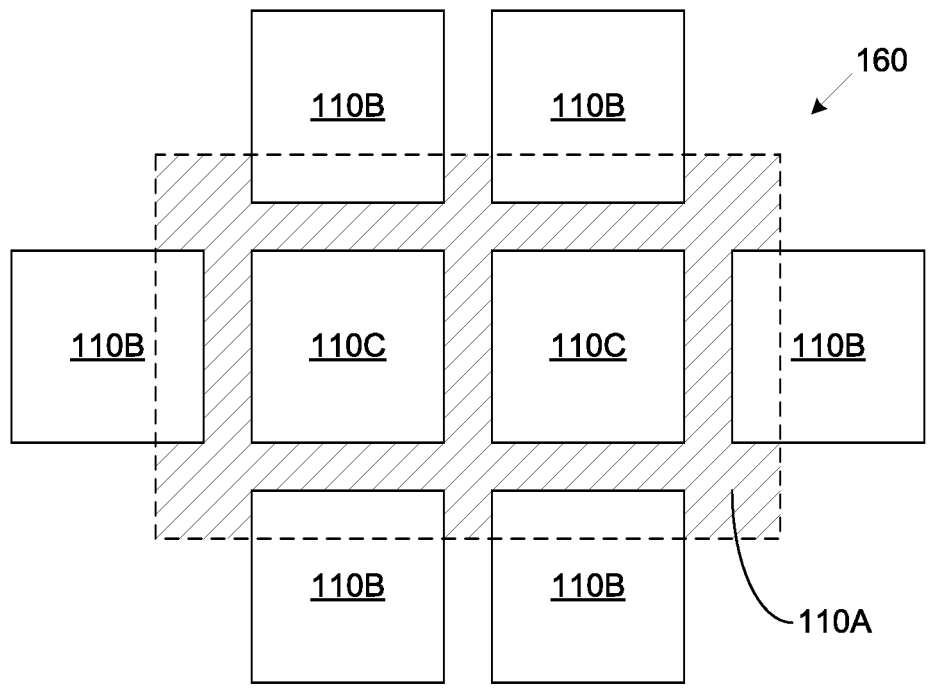

FIG. 4 also illustrates an arrangement in which the integrated circuit device 110A is disposed below multiple different integrated circuit devices 110B. The integrated circuit device 110A may be connected to the substrate 120 (not shown) in any manner disclosed herein with reference to the integrated circuit device $110_1$, while the integrated circuit devices 110B may span the substrate 120 (not shown) and the integrated circuit device 110A (e.g., in any manner disclosed herein with reference to the integrated circuit devices $110_2$ and $110_3$). FIG. 4 also illustrates two integrated circuit devices 110C disposed on the integrated circuit device 110A (e.g., in the manner disclosed herein with reference to the integrated circuit device $110_4$). In FIG. 4, the integrated circuit devices 110B "overlap" the edges of the integrated circuit device 110A, while the integrated circuit devices 110C are wholly above the integrated circuit device 110A. In the embodiment of FIG. 4, the integrated circuit devices 110B and 110C may be arranged in a portion of a rectangular array.

Figure 5:
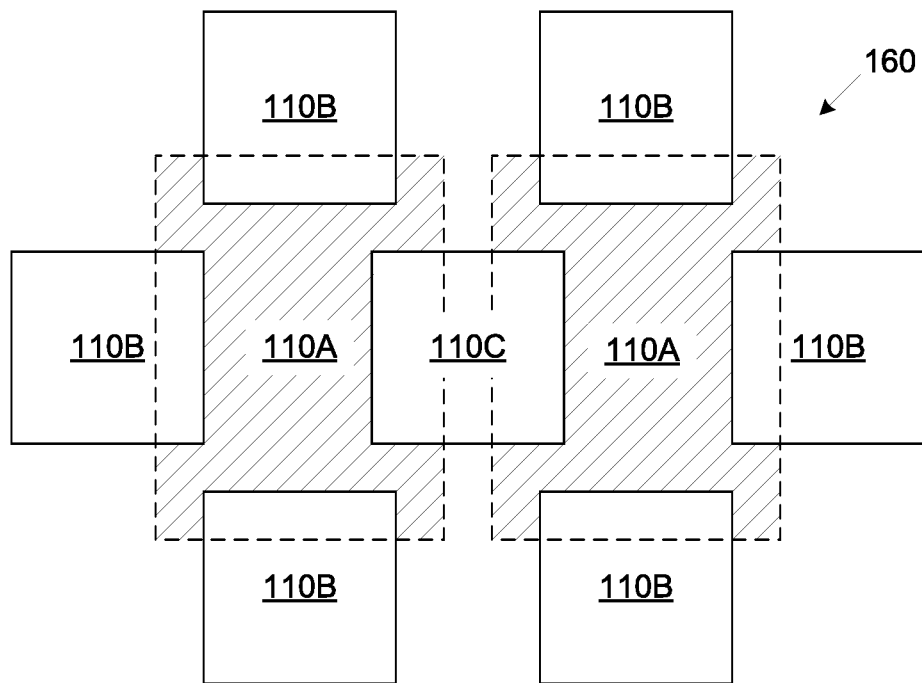

FIG. 5 illustrates an embodiment wherein two integrated circuit devices 110A may take the place of the single integrated circuit device 110A illustrated in FIG. 4, and one or more integrated circuit devices 110C may "bridge" the two integrated circuit devices 110A.

Figure 6:
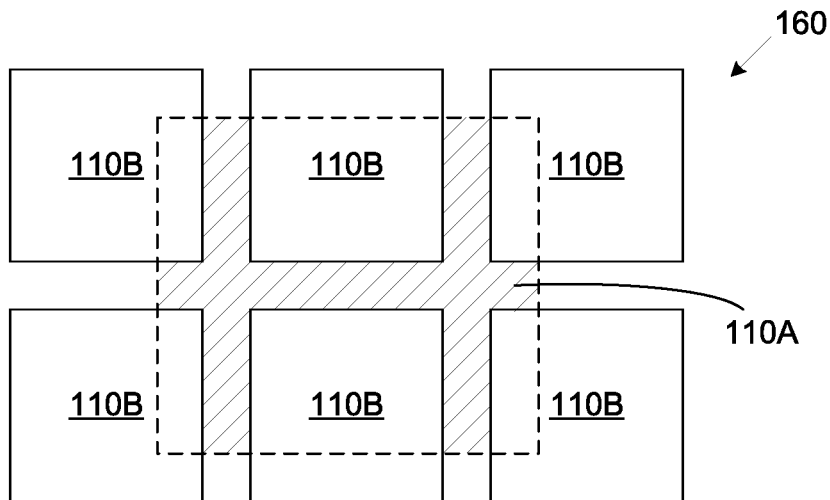

FIG. 6 illustrates an arrangement in which the integrated circuit device 110A is disposed below multiple different integrated circuit devices 110B. The integrated circuit device 110A may be connected to a substrate 120 (not shown) in any manner disclosed herein with reference to the integrated circuit device $110_1$, while the integrated circuit devices 110B may span the substrate 120 and the integrated circuit device 110A (e.g., in any manner disclosed herein with reference to the integrated circuit device $110_2$ and $110_3$). In FIG. 6, the integrated circuit devices 110B "overlap" the edges and/or the corners of the integrated circuit device 110A. In the embodiment of FIG. 6, the integrated circuit devices 110B may be arranged in a portion of a rectangular array.

Figure 7:
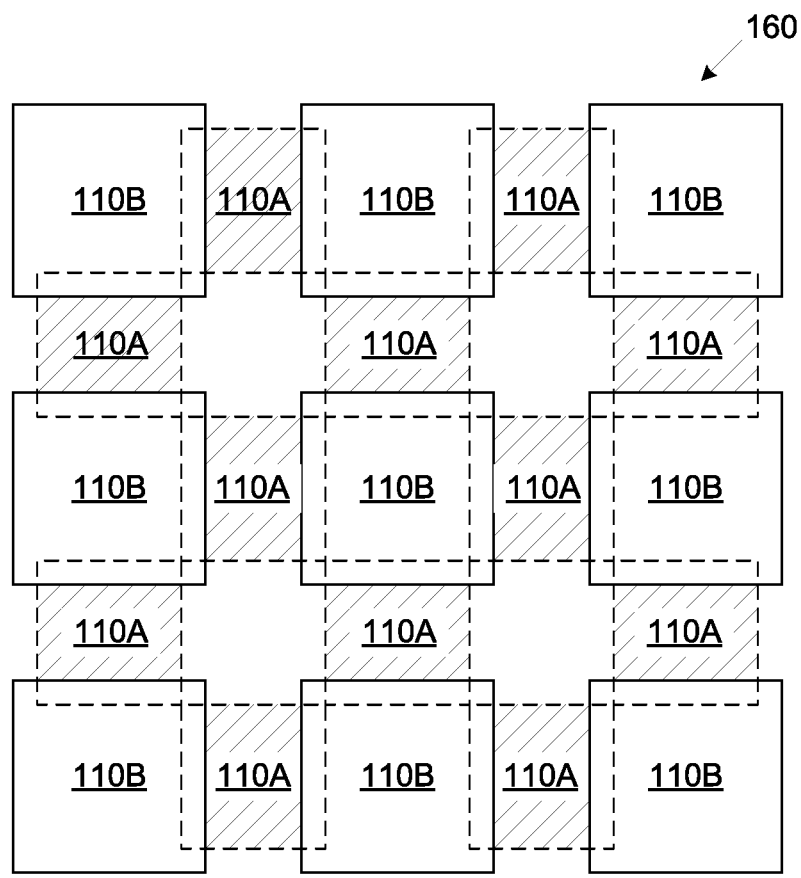

FIG. 7 illustrates an arrangement in which multiple integrated circuit devices 110A are disposed below multiple different integrated circuit devices 110B such that each integrated circuit device 110A bridges two or more horizontally or vertically adjacent integrated circuit devices 110B. The integrated circuit devices 110A may be connected to a substrate 120 (not shown) in any manner disclosed herein with reference to the integrated circuit device $110_1$ of FIG. 2, while the integrated circuit devices 110B may span the substrate 120 (not shown) and the integrated circuit device 110A (e.g., in any manner disclosed herein with reference to the integrated circuit device $110_2$ of FIG. 2). In FIG. 7, the integrated circuit devices 110B "overlap" the edges of the adjacent integrated circuit devices 110A.

Figure 8:
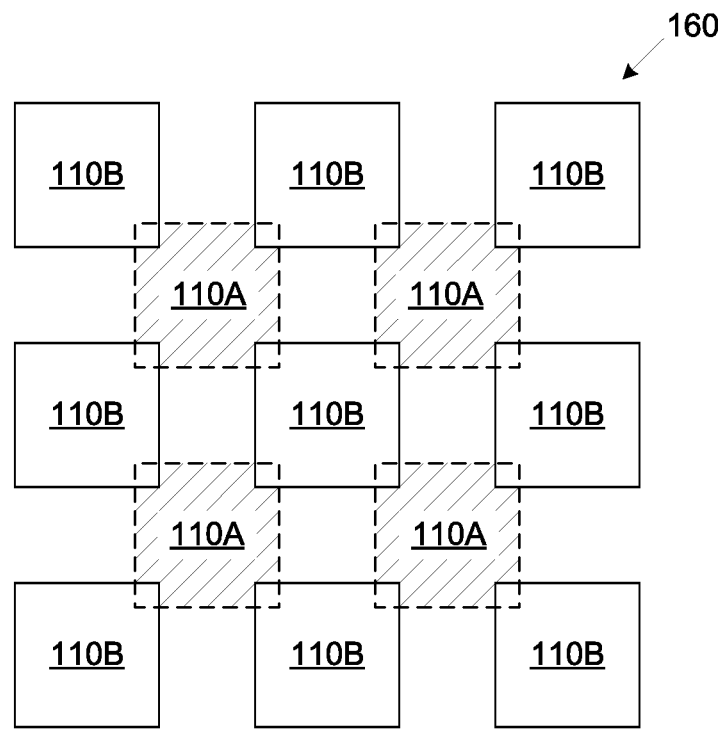

FIG. 8 illustrates an arrangement in which multiple integrated circuit devices 110A are disposed below multiple different integrated circuit devices 110B such that each integrated circuit device 110A bridges the four diagonally adjacent integrated circuit devices 110B. The integrated circuit devices 110A may be connected to the substrate 120 (not shown) in any manner disclosed herein with reference to the integrated circuit device $110_1$ of FIG. 2, while the integrated circuit devices 110B may span the substrate 120 and the integrated circuit device 110A (e.g., in any manner disclosed herein with reference to the integrated circuit devices $110_2$ and $110_3$ of FIG. 2). In FIG. 8, the integrated circuit devices 110B "overlap" the corners of the adjacent integrated circuit devices 110A.

Figure 9:
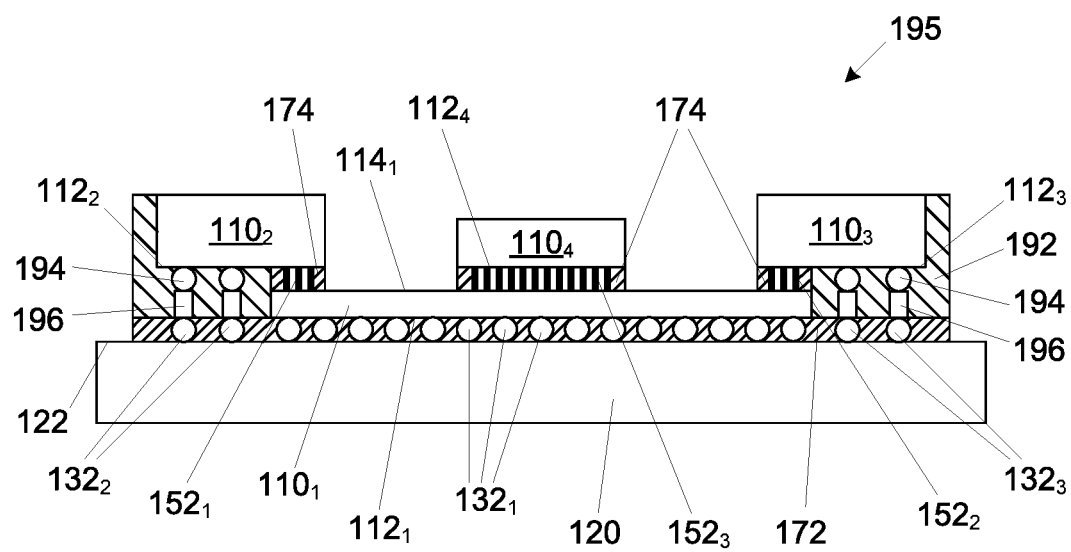
FIG. 9 is a side cross-sectional view of an electronic assembly having stacked integrated circuit devices, according to another embodiment of the present description.

Although some embodiments illustrated in the present description have at least one integrated circuit device, such as integrated circuit device $110_1$ within recess 124 (see FIG. 2) in the substrate 120, the embodiment are not so limited. As shown in FIG. 9, the integrated circuit devices $110_1$-$110_4$ may be configured, stacked, disposed in a mold material 192 to form a molded package 195, and attached in a manner such that a recess is not necessary. As shown, the molded package 195 may include the first integrated circuit device $110_1$ attached to the first surface 122 of the substrate 120 through the first plurality of device-to-substrate interconnects $132_1$. The second integrated circuit device $110_2$ may be attached to the first surface 122 of the substrate 120 through the second plurality of device-to-substrate interconnects $132_2$ which are electrically attached to through-mold interconnects 196 and device interconnects 194 within the molded package 190. The third integrated circuit device $110_3$ may be attached to the first surface 122 of the substrate 120 through the third plurality of device-to-substrate interconnects $132_3$ which are also electrically attached to through-mold interconnects 196 and device interconnects 194 within the molded package 190. The processes for the fabrication of a molded package 195 are well known in the art and for purposes of brevity and conciseness will not be described herein. However, it is noted the mold material 192 is fabricated such that at least a portion of the second surface of the first integrated circuit device $110_1$ is exposed.

The first integrated circuit device $110_1$ and the second integrated circuit device $110_2$ may be electrically attached to one another through the first plurality of high-density interconnects $152_1$. Furthermore, the first integrated circuit device $110_1$ and the third integrated circuit device $110_3$ may be electrically attached to one another through the second plurality of high-density interconnects $152_2$. The first surface $112_4$ of the fourth integrated circuit device $110_4$ may be attached to the second surface $114_1$ of the first integrated circuit device $110_1$ through the third plurality of high-density interconnects $152_3$.

As previously discussed, the first underfill material 172 may be disposed between the first surface $112_1$ of the first integrated circuit device $110_1$ and the first surface 122 of the substrate 120 and may surround the first plurality of device-to-substrate interconnects $132_1$. The first underfill material 172 is further disposed between the mold material 192 and the first surface 122 of the substrate 120 to surround the second plurality of device-to-substrate interconnects $132_2$ and to surround the third plurality of device-to-substrate interconnects $132_3$. The second underfill material 174 may be disposed between the first surface $112_2$ of the second integrated circuit device $110_2$ and the second surface $114_1$ of first integrated circuit device $110_1$ to surround the first plurality of high-density interconnects $152_1$. The second underfill material 174 may further be disposed between the first surface $112_3$ of the third integrated circuit device $110_3$ and the second surface $114_1$ of the first integrated circuit device $110_1$ to surround the second plurality of high-density interconnects $152_2$. The second underfill material 174 may still further be disposed between the second surface $114_1$ of the first integrated circuit device $110_1$ and the first surface $112_4$ of the fourth integrated circuit device $110_4$ to surround the third plurality of high-density interconnects $152_3$. In some embodiments, the mold material 192 and the first underfill material 172 may be the same material. In other embodiments, the mold material 192 and the second underfill material 174 may be the same material.

Figure 10:
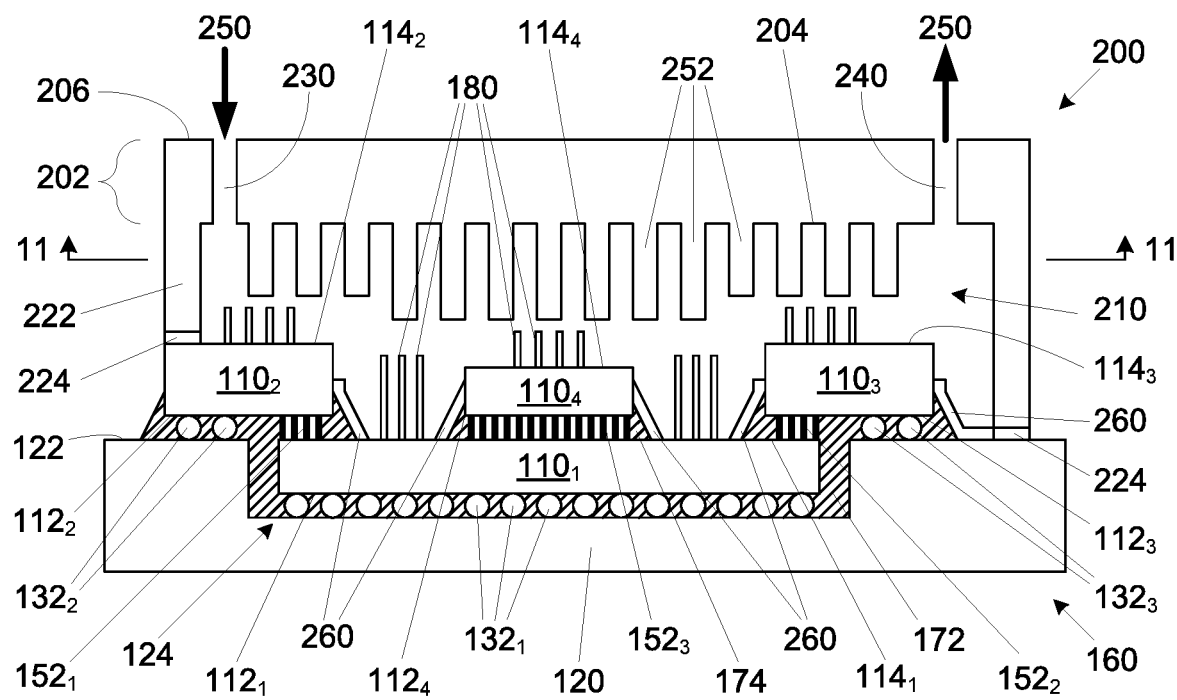
FIG. 10 is a side cross-sectional view of an electronic assembly having stacked integrated circuit devices coupled to a direct fluid contact heat dissipation device, according to one embodiment of the present description.

As illustrated in FIG. 10 and according to one embodiment of the present description, a heat dissipation device 200 may be attached to the first surface 122 of the substrate 120 of the assembly of FIG. 2, wherein the heat dissipation device 200 defines a fluid chamber 210. In one embodiment of the present description, the heat dissipation device 200 may comprise a main body 202, having a first surface 204 and an opposing second surface 206, and a boundary wall 222 extending from the first surface 204 of the main body 202 of the heat dissipation device 200. The boundary wall 222 may be attached or sealed to the first surface 122 of the substrate 120 with an attachment adhesive or sealant layer 224. In another embodiment, at least a portion of the boundary wall 222 may be attached or sealed to a second surface $114_1$-$114_4$ of at least one of the integrated circuit devices $110_1$-$110_4$, respectively (illustrated in FIG. 10 as being attached or sealed to the second surface $114_2$ of integrated circuit device $110_2$). As illustrated in FIG. 10, the heat dissipation device 200 may be a single material throughout, such as when the heat dissipation device 200, including the boundary wall 222, is formed by a single process step, including but not limited to stamping, skiving, molding, and the like. In one embodiment, the heat dissipation device footing 222 may be a single "picture frame" structure substantially surrounding the integrated circuit devices $110_1$, $110_2$, $110_3$, $110_4$.

The attachment adhesive or sealant layer 224 may be any appropriate material, including, but not limited to, silicones (such as polydimethylsiloxane), epoxies, and the like. The heat dissipation device 200 may be made of any appropriate thermally conductive material, including, but not limited to at least one metal material and alloys of more than one metal. In one embodiment, the heat dissipation device 200 may comprise copper, nickel, aluminum, alloys thereof, laminated metals including coated materials (such as nickel coated copper), and the like.

As shown in FIG. 10, the fluid chamber 210 may be substantially defined by the first surface 204 of the main body 202 of the heat dissipation device 200, the boundary wall 222 of the heat dissipation device 200, the substrate 120, and the components on the substrate 120 surrounded by the boundary wall 222 (e.g. integrated circuit devices $110_1$, $110_2$, $110_3$, $110_4$, etc.). An inlet conduit 230 may extend from the second surface 206 of the main body 202 of the heat dissipation device 200 to the first surface 204 of the main body 202 of the heat dissipation device 200. An outlet conduit 240 may extend from the first surface 204 of the main body 202 of the heat dissipation device 200 to the second surface 206 of the main body 202 of the heat dissipation device 200. A heat transfer fluid 250 (illustrated generically as a down arrow (left side) and an up arrow (right side)) may flow into the fluid chamber 210 through the inlet conduit 230 and out of the fluid chamber 210 through the outlet conduit 240. In one embodiment, the fluid chamber 210 is sealed to contain the heat transfer fluid 250 and allows for the heat transfer fluid 250 to directly contact at least a portion of second surface $114_1$-$114_4$ of each of the integrated circuit devices $110_1$-$110_4$, respectively. The heat transfer fluid 250 may be any appropriate gas or liquid, or a combination thereof. In one embodiment, the heat transfer fluid 250 may comprise water. In another embodiment, the heat transfer fluid 250 may comprise a dielectric refrigerant. In a further embodiment, the heat transfer fluid 250 may comprise an oil. In other embodiments, the heat transfer fluid 250 may be comprised of two phases (such as liquid water and water vapor, or liquid-phase and gas-phase dielectric refrigerant) that exist simultaneously in one or more regions of the fluid chamber 210.

It is understood that the heat transfer fluid 250 may not be compatible with all of the components within the electronic assembly 160, such as the first underfill material 172, the second underfill material 174, and/or the substrate 120. For example, the components may be made of porous material that may lead to the heat transfer fluid 250 migrating though the porous material and damaging components within the electronic assembly 160. Thus, a coating 260 may be deposited on exposed surfaces of such components. In one embodiment, the coating 260 may cover a portion of the first underfill material 172 and/or a portion of the second underfill material 174. In another embodiment, the coating 260 may abut the first surface 122 of the substrate 120. In still another embodiment, the coating 260 may extend between the first integrated circuit device $110_1$ and the second integrated circuit device $110_2$.

In order to enhance heat transfer from the integrated circuit devices $110_1$-$110_4$, thermally conductive projections 180 may be formed on the second surface $114_1$-$114_4$ of any of the integrated circuit devices $110_1$-$110_4$, respectively, to extend into the fluid chamber 210. The thermally conductive projections 180 may be any appropriate shape, including, but not limited to, fins, pillars, and the like. The thermally conductive projections 180 may be made from any appropriate thermally conductive material including but not limited to copper, silver, nickel, alloys thereof, and the like. It is understood that the thermally conductive projections 180 may provide additional surface area for the transfer of heat from integrated circuit devices $110_1$-$110_4$ by the heat transfer fluid 250. The fabrication and attachment of such thermally conductive projections 180 are well known in the art and for the sake of brevity and conciseness will not be described herein.

Likewise, in order to enhance heat transfer from the heat transfer fluid 250 to the heat dissipation device 200, thermally conductive projections 252 may be formed on the first surface 204 of the heat dissipation device 200, as shown in FIG. 2. The thermally conductive projections 252 may be any appropriate shape, including, but not limited to, fins, pillars, and the like. The thermally conductive projections 252 may be formed and attached to the first surface 204 of the heat dissipation device 200 or they may be formed as a single material with the heat dissipation device 200, such as when the heat dissipation device 200 is formed by a single process step, including but not limited to stamping, skiving, molding, and the like. It is understood that the thermally conductive projections 252 may provide additional surface area for the transfer of heat from the heat transfer fluid 250 to the heat dissipation device 200.

Figure 11:
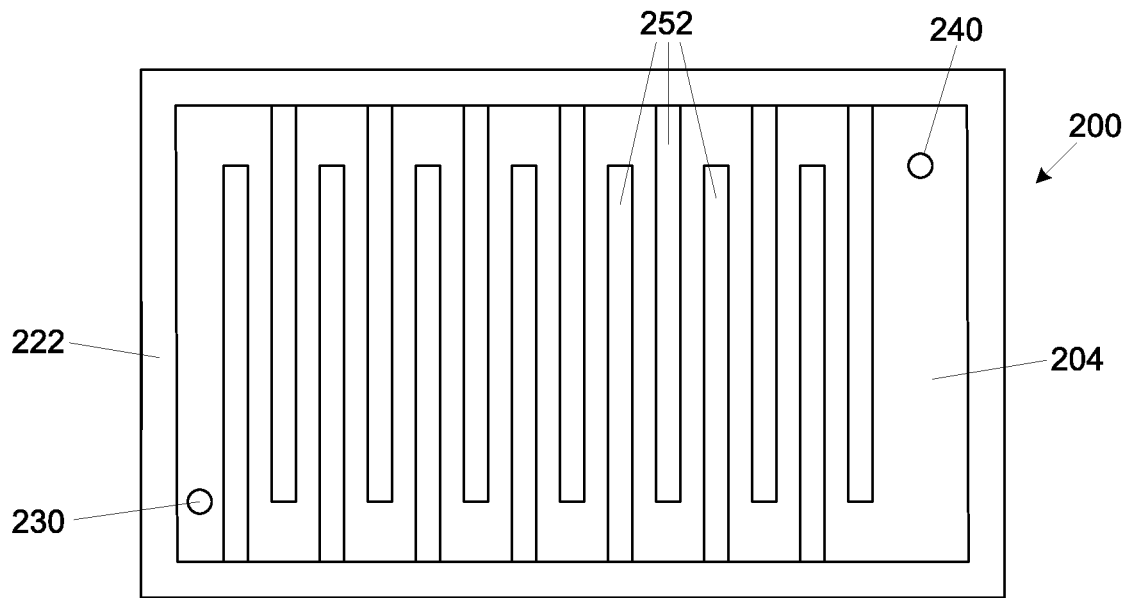
FIG. 11 is a cross-sectional view of the direct fluid contact heat dissipation device along line 11-11 of FIG. 10, according to an embodiment of the present description.

As shown in FIG. 11 (as cross-sectional view along line 11-11 of FIG. 10), the thermally conductive projections 252 may be fins arranged in a staggered fashion between the inlet conduit 230 and the outlet conduit 240, such that the heat transfer fluid 250 may follow a circuitous route from the inlet conduit 230 to the outlet conduit 240, which also increases the residence time of the heat transfer fluid 250 within the fluid chamber 210 (see FIG. 10).

Figure 12:
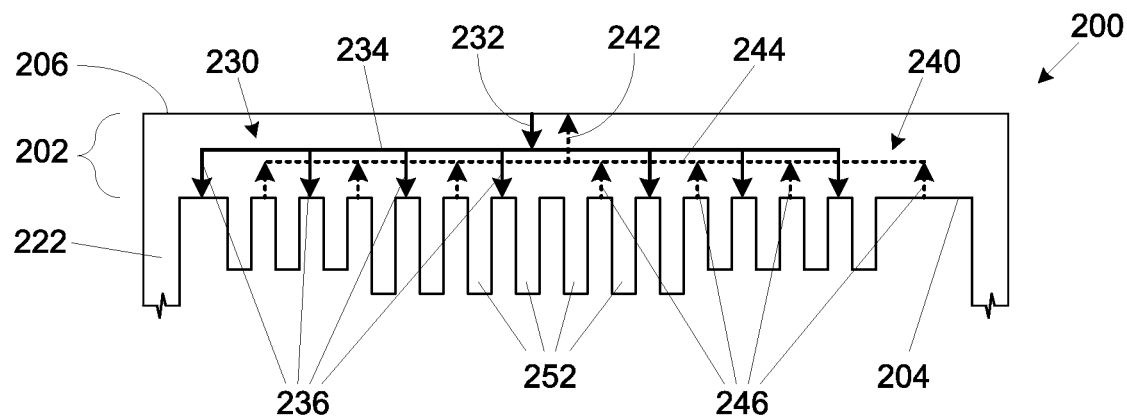
FIG. 12 is a side cross-sectional view of a direct fluid contact heat dissipation device having manifolded inlet and outlet ports, according to one embodiment of the present description.

In an embodiment of the present description, the inlet conduit 230 and the outlet conduit 240 may be arranged as a manifold system in order to introduce and removed the heat transfer fluid 250 (see FIG. 11) in multiple locations. As shown in FIG. 12, the inlet conduit 230 may comprise a main inlet port 232 (illustrated as an arrow) extending from the second surface 206 of the main body 202 of the heat dissipation device 200 to an inlet channel 234 (illustrated as a line) extending through the main body 202 and a plurality of distribution inlet ports 236 (illustrated as arrows) extending from the inlet channel 234 to the first surface 204 of the main body 202 of the heat distribution device 200. It is understood that the inlet conduit 230 may have any number of main inlet ports 232, inlet channels 234, and distribution inlet ports 236 in any appropriate configuration. The outlet conduit 240 may comprise a plurality of distribution outlet ports 246 (illustrated as dashed arrows) extending from the first surface 204 of the main body 202 of the heat distribution device 200 to an outlet channel 244 (illustrated as a dashed line) extending though the main body 202 of the heat dissipation device 200 and a main outlet port 242 (illustrated as a dashed arrow) extending from the outlet channel 244 to the second surface 206 of the main body 202 of the heat distribution device 200. It is understood that the outlet conduit 240 may have any number of main outlet ports 242, outlet channels 244, and distribution outlet ports 246 in any appropriate configuration.

Figure 13:
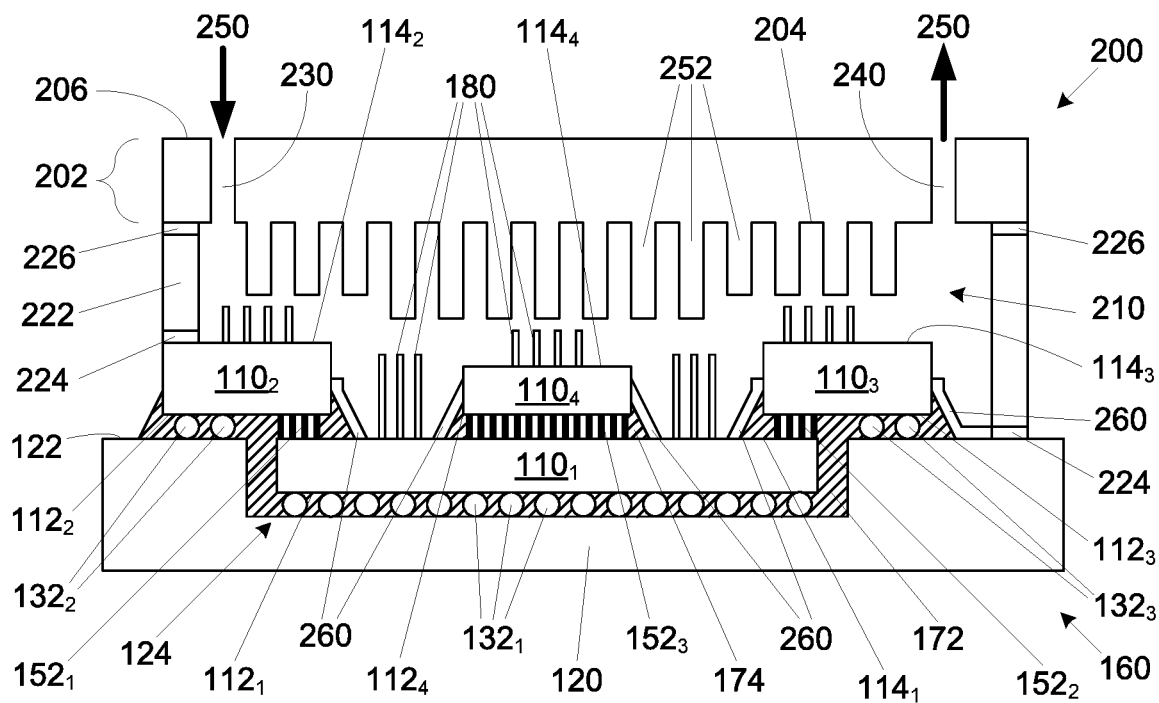
FIG. 13 is a side cross-sectional view of an integrated circuit structure having stacked integrated circuit devices coupled to a direct fluid contact heat dissipation device having a separately fabricated boundary wall, according to another embodiment of the present description.

Although the heat dissipation device 200 illustrated in FIG. 10 shows the boundary wall 222 as a single material with the main body 202, the embodiments of the present description are not so limited. As shown in FIG. 13, in further embodiments of the present description, the heat dissipation device 200 may consist of at least two parts, wherein a main portion 202 of the heat dissipation device 200 and the boundary wall 222 are separate parts. As shown, the boundary wall 222 may be attached to the first surface 204 of the main body 202 with an adhesive or sealant layer 226. Although fabricating the heat dissipation device 200 as a multiple piece assembly will take additional assembly steps, it may make the fabrication of the heat dissipation device 200 easier, as a whole. The adhesive or sealant layer 226 may be any appropriate material, including, but not limited to silicones (such as polydimethylsiloxane), epoxies, and the like. In one embodiment, the adhesive or sealant layer 226 may be the same as the attachment adhesive or sealant layer 224.

In a further embodiment, the underfill material within the microelectronic package 100 may be utilized to form channels under at least one of the integrated circuit devices $110_1$-$110_4$, such that the heat transfer fluid 250 can flow through the channels to remove heat from the first surfaces $112_1$-$12_4$ of any of the integrated circuit devices $110_1$-$110_4$, respectively.

Figure 14:
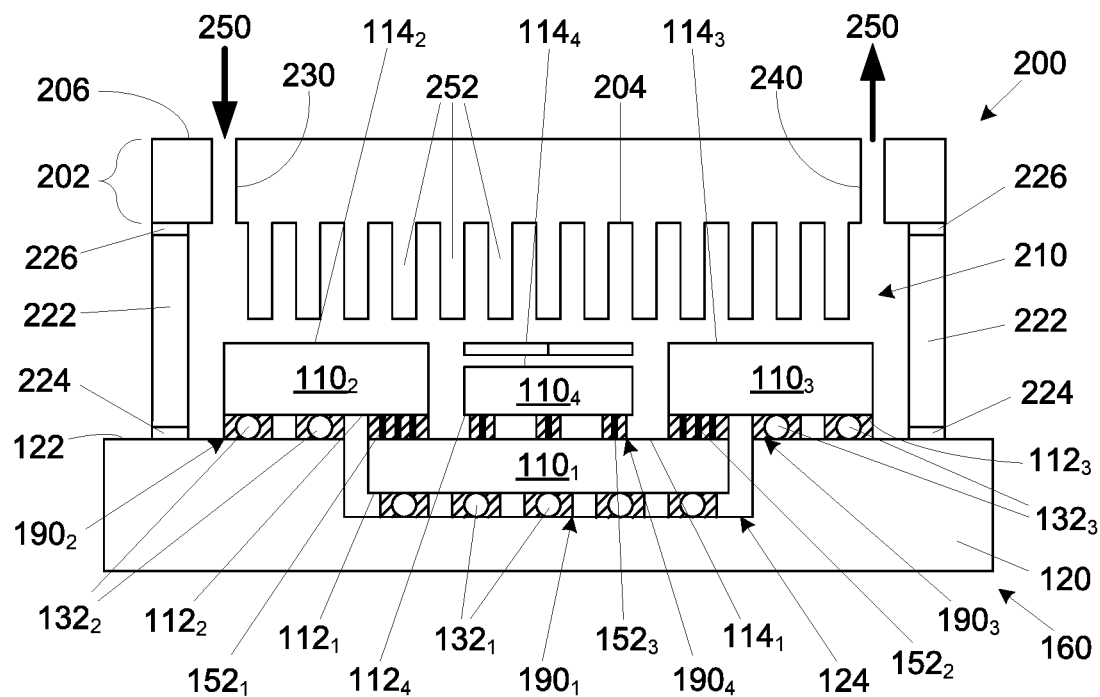
FIG. 14 is a side cross-sectional view of an integrated circuit structure having stacked integrated circuit devices coupled to a direct fluid contact heat dissipation device wherein the underfill material of each of the stacked integrated circuits devices includes channels to facilitate heat removal from a first surface of each of the stacked integrated circuit devices, according to one embodiment of the present description.
Figure 15:
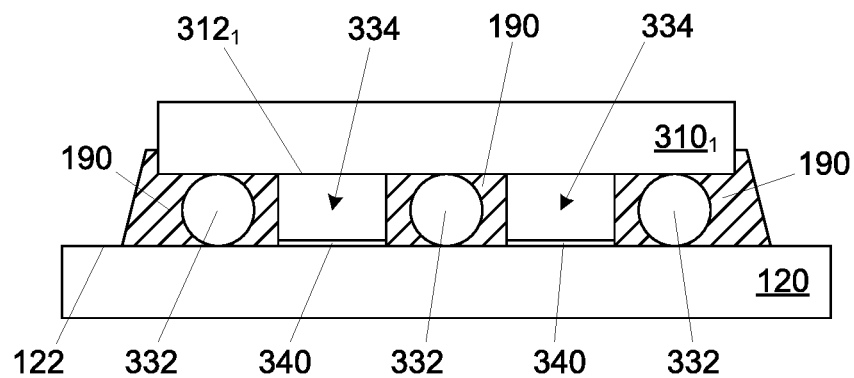
FIG. 15 is a side cross-sectional view of an integrated circuit device attached to a substrate, wherein the underfill material therebetween includes channels to facilitate heat removal from a first surface of the integrated circuit device, according to an embodiment of the present description.

As shown in FIG. 14, each of the integrated circuit devices $110_1$, $110_2$, $110_3$, $110_4$ may have a separate, patterned underfill material structure $190_1$, $190_2$, $190_3$, $190_4$, respectively, disposed between integrated circuit devices $110_1$, $110_2$, $110_3$, $110_4$, the substrate 120, and/or an integrated circuit device upon which it is stacked. FIG. 15 illustrates an exemplary configuration of a first integrated circuit device $310_1$ attached to the first surface 122 of the substrate 120. As shown, a first surface $312_1$ of the first integrated circuit device $310_1$ may be attached to the first surface 122 of the substrate 120 through a plurality of interconnects 332, such as reflowable solder bumps or balls. The plurality of interconnects 332 may extend from bond pads (not shown) on the first surface $312_1$ of the first integrated circuit device $310_1$ and bond pads (not shown) on the first surface 122 of the substrate 120. As shown, a patterned underfill material 190 may surround each of the plurality of interconnects 332 such that at least one channel 334 is formed between at least two of the interconnects 332. As further shown in FIG. 15, a portion of the first surface $312_1$ of the first integrated circuit device $310_1$ may be exposed within the at least one channel 334. The at least one channel 334 will be connected to the fluid chamber 210 (see FIG. 14), such that the heat transfer fluid 250 (see FIG. 14) will contact the first surface $312_1$ of the first integrated circuit device $310_1$ so as to remove heat from the first integrated circuit device $310_1$. A sealant or coating layer 340 may be patterned within the at least one channel 334 to abut the first surface 122 of the substrate 120, when the substrate 120 is incompatible with the heat transfer fluid 250 (see FIG. 14), as previously discussed.

Figure 16:
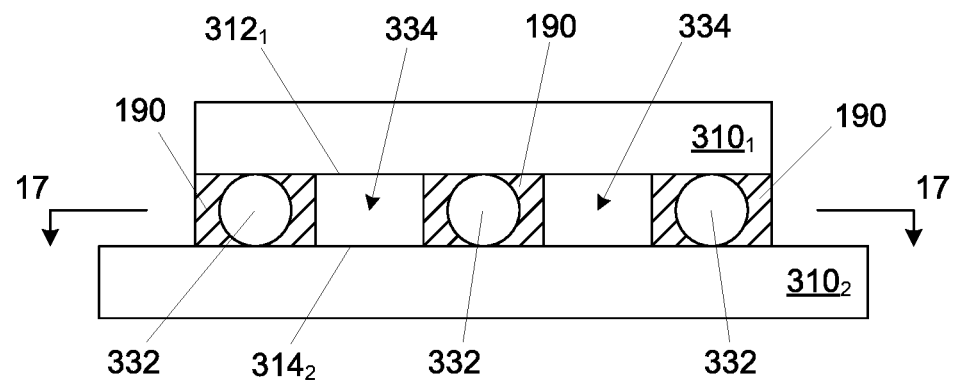
FIG. 16 is a side cross-sectional view of a first integrated circuit device attached to a second integrated circuit device, wherein the underfill material therebetween includes channels to facilitate heat removal from a first surface of the first integrated circuit device and a second surface of the second integrated circuit device, according to an embodiment of the present description.

FIG. 16 illustrates an exemplary configuration of the first integrated circuit device $310_1$ attached to a second integrated circuit device $310_2$, according to another embodiment of the present description. As shown, a first surface $312_1$ of the first integrated circuit device $310_1$ may be attached to a second surface $314_2$ of a second integrated circuit device $310_2$ through a plurality of interconnects 332, such as reflowable solder bumps or balls. The plurality of interconnects 332 may extend from bond pads (not shown) on the first surface $312_1$ of the first integrated circuit device $310_1$ and bond pads (not shown) on the second surface $314_2$ of the second integrated circuit device $310_2$. As shown, the patterned underfill material 190 may surround each of the plurality of interconnects 332 such that at least one channel 334 is formed between at least two of the interconnects 332. As shown in FIG. 16, at least a portion of both the first surface $312_1$ of the first integrated circuit device $310_1$ and the second surface $314_2$ of the second integrated circuit device $310_2$ may both be exposed within the at least one channel 334. The at least one channel 334 will be connected to the fluid chamber 210 (see FIG. 14), such that the heat transfer fluid 250 (see FIG. 14) will contact both the first surface $312_1$ of the first integrated circuit device $310_1$ and the second surface $314_2$ of the second integrated circuit device $310_2$ so as to remove heat from both the first integrated circuit device $310_1$ and the second integrated circuit device $310_2$.

Figure 17:
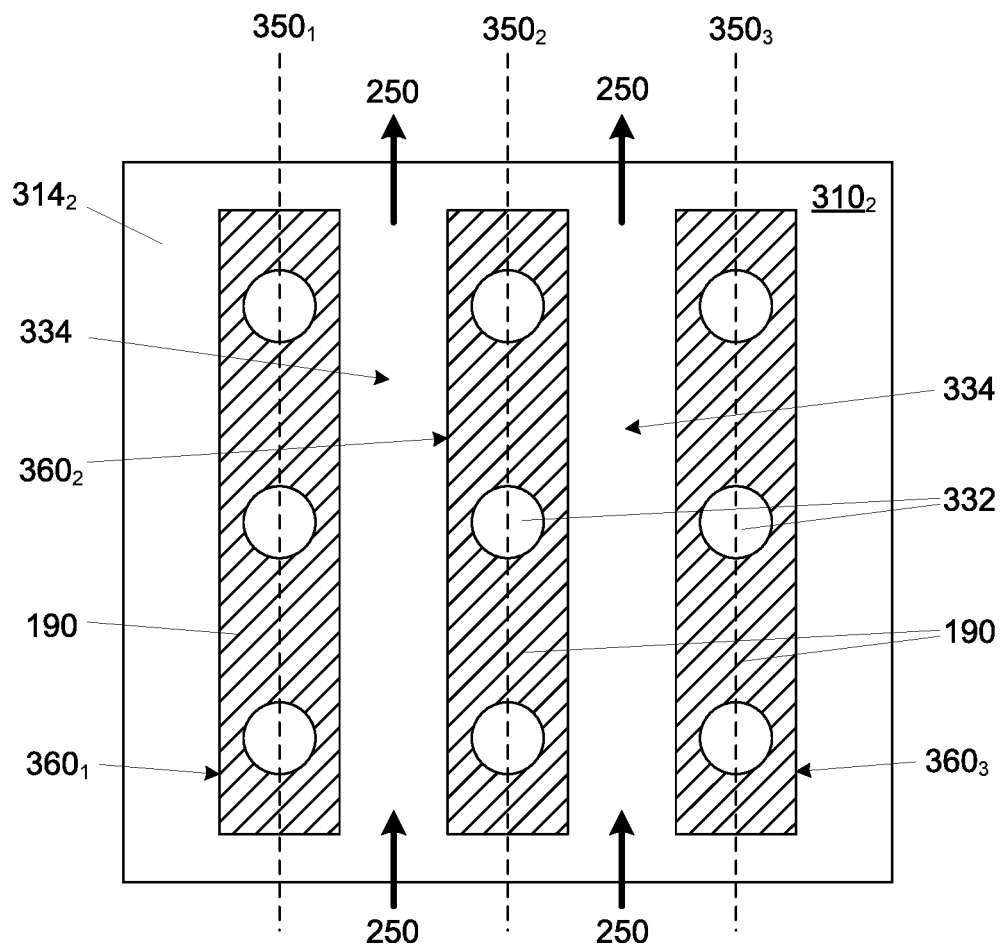
FIG. 17 is a top cross-sectional view along line 17-17 of FIG. 16, according to an embodiment of the present description.

FIG. 17 illustrates an embodiment of the configuration of channels 334, along line 17-17 of FIG. 16. As shown, the interconnects 332 may be aligned in rows $350_1$-$350_3$, (shown as dashed lines), wherein each of the rows $350_1$-$350_3$ of interconnects 332 are encapsulated in the underfill material 190 to form a plurality of channel walls $360_1$-$360_3$, wherein a plurality of channels 334 are defined between the channel walls $360_1$-$360_3$. In one embodiment, the plurality of channels 334 may be substantially parallel to the flow of the heat transfer fluid (illustrated by arrows 250), e.g. in the general direction of the inlet conduit 230 to the outlet conduit 240 (shown in FIG. 14).

The structure of FIG. 17 may be formed by patterning the underfill material 190 on the second integrated circuit device $310_2$ (see FIG. 16) and attaching the interconnects 332 to the first integrated circuit device $310_1$ (see FIG. 16) prior to attaching the first integrated circuit device $310_1$ to the second integrated circuit device $310_2$. During attachment, the interconnects 332 may be pressed through the underfill material 190 and, when the interconnects 332 are made of solder, the solder may be reflowed, either by heat, pressure, and/or sonic energy to secure the solder and make an electrical connection between the first integrated circuit device $310_1$ (see FIG. 16) and the second integrated circuit device $310_2$ (see FIG. 16). The specific processes and materials used in the fabrication of the patterned underfill material 190 are known in the art and for the purposes of brevity and conciseness will not be described therein.

Figure 18:
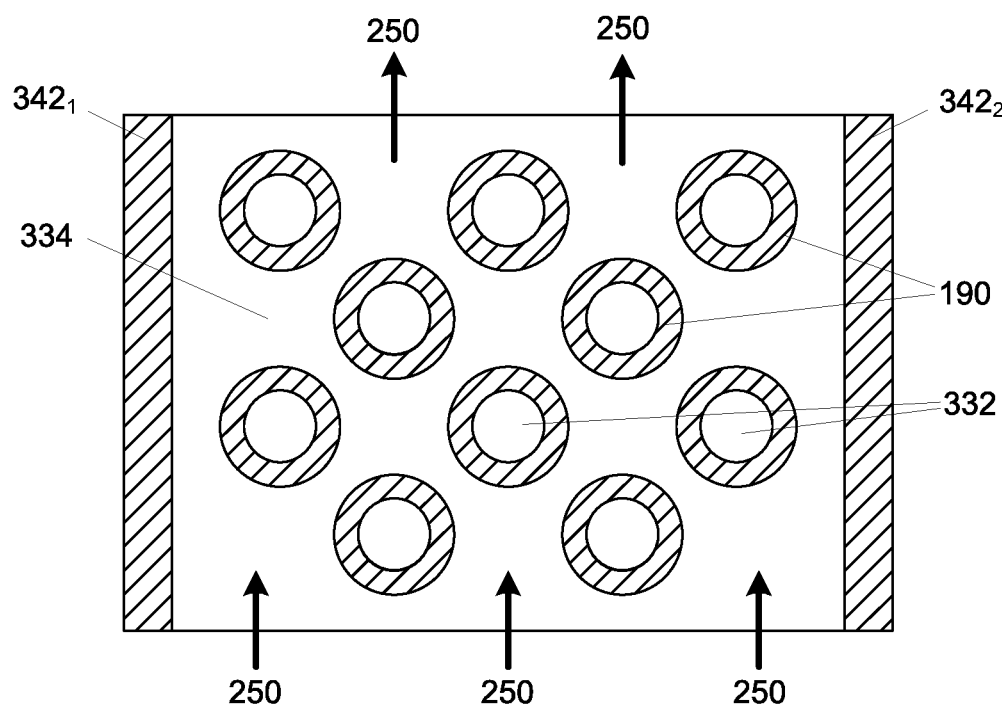
FIG. 18 is a top cross-sectional view of a channel configuration, according to another embodiment of the present description.

FIG. 18 illustrates one embodiment of the configuration of a single channel 334. As shown, each individual interconnect 332 may be encapsulated in the underfill material 190, wherein the single channel 334 is defined by two opposing side walls $342_1$ and $342_2$, and wherein the interconnects 332 are disposed between the opposing side walls $342_1$ and $342_2$. In one embodiment, the opposing side walls $342_1$ and $342_2$ may be substantially parallel to the flow of the heat transfer fluid (illustrated by arrows 250), e.g. in the general direction of the inlet conduit 230 to the outlet conduit 240 (shown in FIG. 14).

As with the structure shown in FIG. 17, the structure shown in FIG. 18 may be formed by patterning the underfill material 190 on the second integrated circuit device $310_2$ (see FIG. 16) and attaching the interconnects 332 to the first integrated circuit device $310_1$ (see FIG. 16) prior to attaching the first integrated circuit device $310_1$ to the second integrated circuit device $310_1$. During attachment, the interconnects 332 may be pressed through the underfill material 190 and, when the interconnects 332 are made of solder, the solder may be reflowed, either by heat, pressure, and/or sonic energy to secure the solder and make an electrical connection between the first integrated circuit device $310_1$ (see FIG. 16) and the second integrated circuit device $310_2$ (see FIG. 16). The specific processes and materials used in the fabrication of the patterned underfill material 190 are known in the art and for the purposes of brevity and conciseness will not be described therein.

It is, of course, understood that the embodiments illustrated in FIGS. 17 and 18 are merely exemplary and the channel(s) 334 may have any appropriate configuration.

Figure 19:
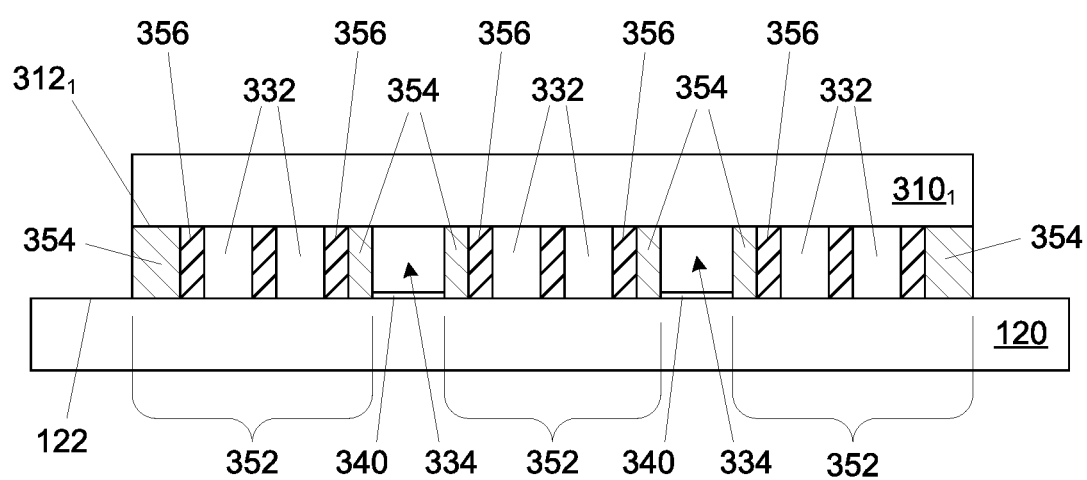
FIG. 19 is a side cross-sectional view of an integrated circuit device attached to a substrate wherein channels are formed to facilitate heat removal from a first surface of the integrated circuit device and wherein the interconnects between the integrated circuit are positioned in groupings and the groupings are surrounded by a sealing structure, according to an embodiment of the present description.

FIGS. 19-24 illustrate further embodiments of the configuration of the channel 334, wherein the interconnects 332 are grouped and surrounded by a sealing structure. FIG. 19 illustrates an exemplary configuration of the first integrated circuit device $310_1$ attached to the first surface 122 of the substrate 120. As shown, the first surface $312_1$ of the first integrated circuit device $310_1$ may be attached to the first surface 122 of the substrate 120 through at least one interconnect grouping or island 352. The at least one interconnect grouping or island 352 may comprises a plurality of interconnects 332 surrounded by a sealing structure 354. The plurality of interconnects 332 may extend from bond pads (not shown) on the first surface $312_1$ of the first integrated circuit device $310_1$ and bond pads (not shown) on the first surface 122 of the substrate 120. The sealing structure 354 may extend between the first surface $312_1$ of the first integrated circuit device $310_1$ and the first surface 122 of the substrate 120. In one embodiment, the sealing structures 354 may be electrically conductive and may form an electrical connection between the first integrated circuit device $310_1$ and the substrate 120. In a further embodiment, the material used to form the interconnects 332 may be the same as the material used to form the sealing structures 354, such as a solder material. In one embodiment, an underfill material 356 may be disposed within the grouping between the plurality of interconnects 332 and the sealing structure 354.

As further shown in FIG. 19, a portion of the first surface $312_1$ of the first integrated circuit device $310_1$ may be exposed within the at least one channel 334. The at least one channel 334 will be connected to the fluid chamber 210 (see FIG. 14), such that the heat transfer fluid 250 (see FIG. 14) will contact the first surface $312_1$ of the first integrated circuit device $310_1$, so as to remove heat from the first integrated circuit device $310_1$. A sealant or coating layer 340 may be patterned within the at least one channel 334 to abut the first surface 122 of the substrate 120, when the substrate 120 is incompatible with the heat transfer fluid 250.

Figure 20:
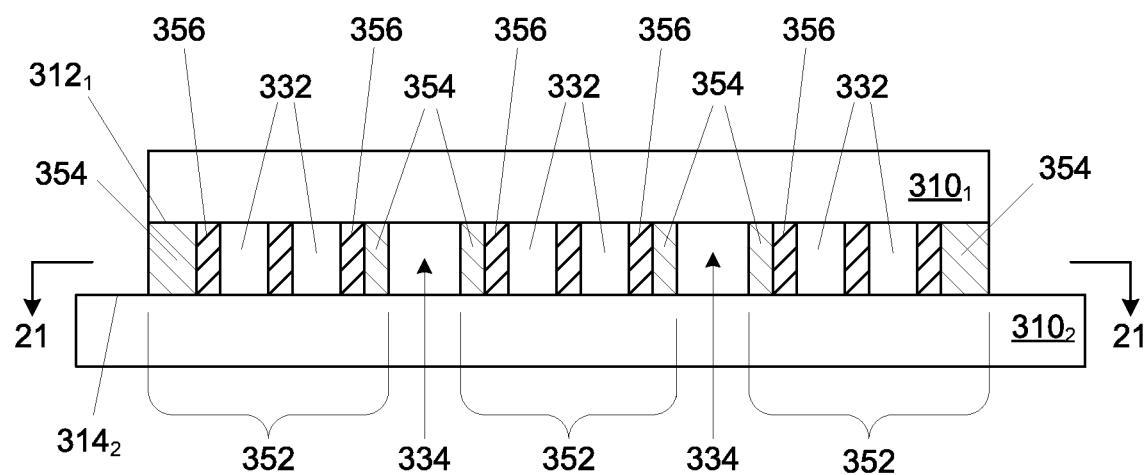
FIG. 20 is a side cross-sectional view of a first integrated circuit device attached to a second integrated circuit device (along line 20-20 of FIG. 21), wherein channels are formed to facilitate heat removal from a first surface of the first integrated circuit device and a second surface of the second integrated circuit device, according to an embodiment of the present description.

FIG. 20 illustrates an exemplary configuration of a first integrated circuit device $310_1$ attached to a second integrated circuit device $310_2$, according to another embodiment of the present description. As shown, a first surface $312_1$ of the first integrated circuit device $310_1$ may be attached to a second surface $314_2$ of a second integrated circuit device $310_2$ through at least one interconnect grouping or island 352. As with the embodiment of FIG. 19, the at least one interconnect grouping or island 352 may comprises a plurality of interconnects 332 surrounded by the sealing structure 354. The plurality of interconnects 332 may extend from bond pads (not shown) on the first surface $312_1$ of the first integrated circuit device $310_1$ and bond pads (not shown) on the second surface $314_2$ of the second integrated circuit device $310_2$. The sealing structure 354 may extend between the first surface $312_1$ of the first integrated circuit device $310_1$ and the second surface $314_2$ of the second integrated circuit device $310_2$. In one embodiment, the sealing structures 354 may be electrically conductive and may form an electrical connection between the first integrated circuit device $310_1$ and the second integrated circuit device $310_2$. In a further embodiment, the material used to form the interconnects 332 may be the same as the material used to form the sealing structures 354, such as a solder material. In one embodiment, the underfill material 356 may be disposed within the grouping between the plurality of interconnects 332 and the sealing structure 354.

As shown, the interconnect groupings 352 may be arranged such that at least one channel 334 is formed. As shown in FIG. 20, at least a portion of both the first surface $312_1$ of the first integrated circuit device $310_1$ and the second surface $314_2$ of the second integrated circuit device $310_2$ may both be exposed within the at least one channel 334. The at least one channel 334 will be connected to the fluid chamber 210 (see FIG. 14), such that the heat transfer fluid 250 (see FIG. 14) will contact both the first surface $312_1$ of the first integrated circuit device $310_1$ and the second surface $314_2$ of the second integrated circuit device $310_2$ so as to remove heat from both the first integrated circuit device $310_1$ and the second integrated circuit device $310_2$.

Figure 21:
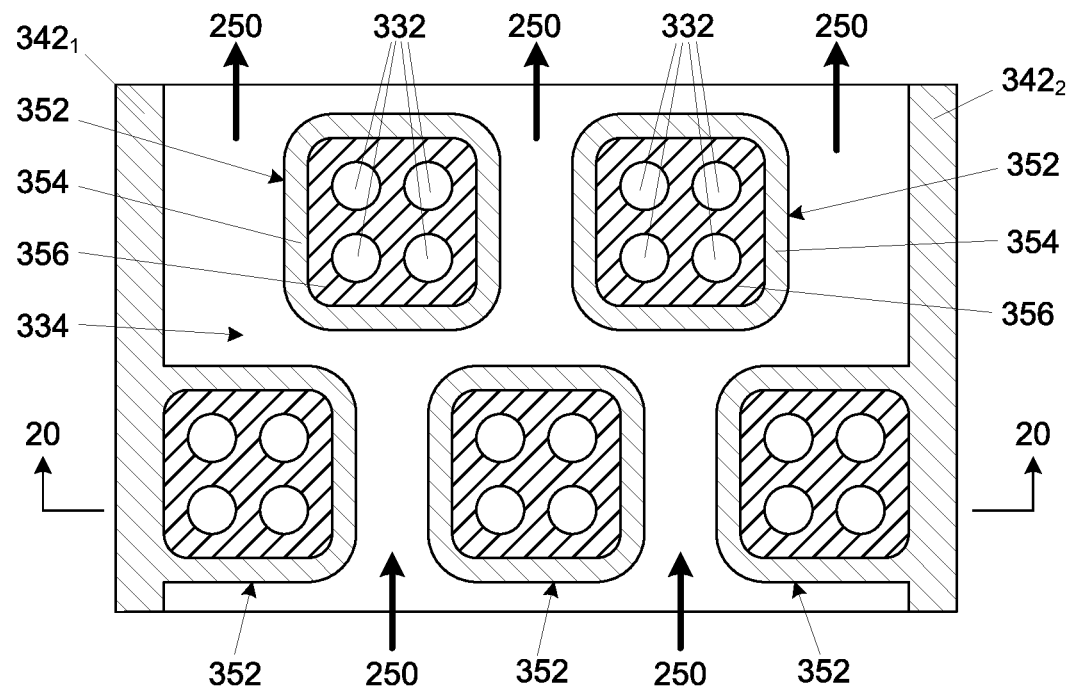
FIGS. 21-24 are top cross-sectional views of various channel configurations having interconnects in groupings, according to another embodiment of the present description.

FIG. 21 illustrates one embodiment of the configuration of a channel 334 along line 21-21 of FIG. 20, wherein the channel 334 is defined by two opposing side walls $342_1$ and $342_2$ and the interconnects 332 are disposed between the opposing side walls $342_1$ and $342_2$. In one embodiment, the opposing side walls $342_1$ and $342_2$ may extend substantially parallel to the flow of the heat transfer fluid (illustrated by arrows 250), e.g. in the general direction of the inlet conduit 230 to the outlet conduit 240 (shown in FIG. 14). In one embodiment, the two opposing side walls $342_1$ and $342_2$ may be formed from the same material as is used to form the sealing structure 354. In a further embodiment, at least one of the side walls $342_1$ and $342_2$ maybe conjoined with one of the sealing structures 354 of at least one interconnect grouping 352. The specific processes and materials used in the fabrication of the groupings 352 and side walls $342_1$ and 342₂ are known in the art and for the purposes of brevity and conciseness will not be described therein.

Figure 22:
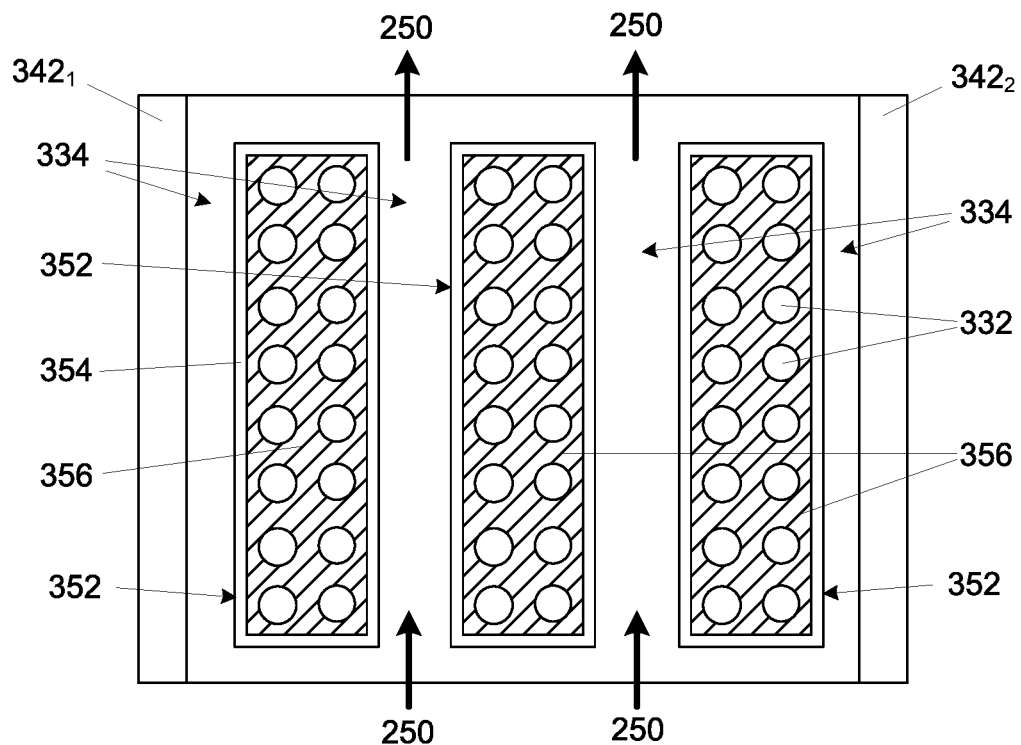
Figure 23:
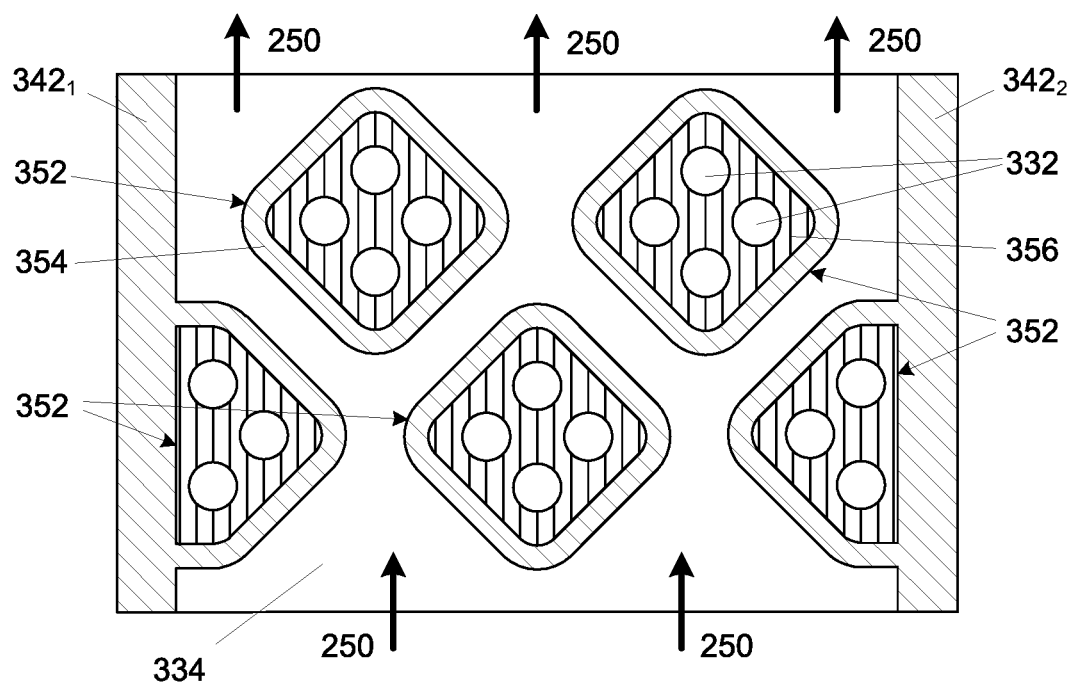
Figure 24:
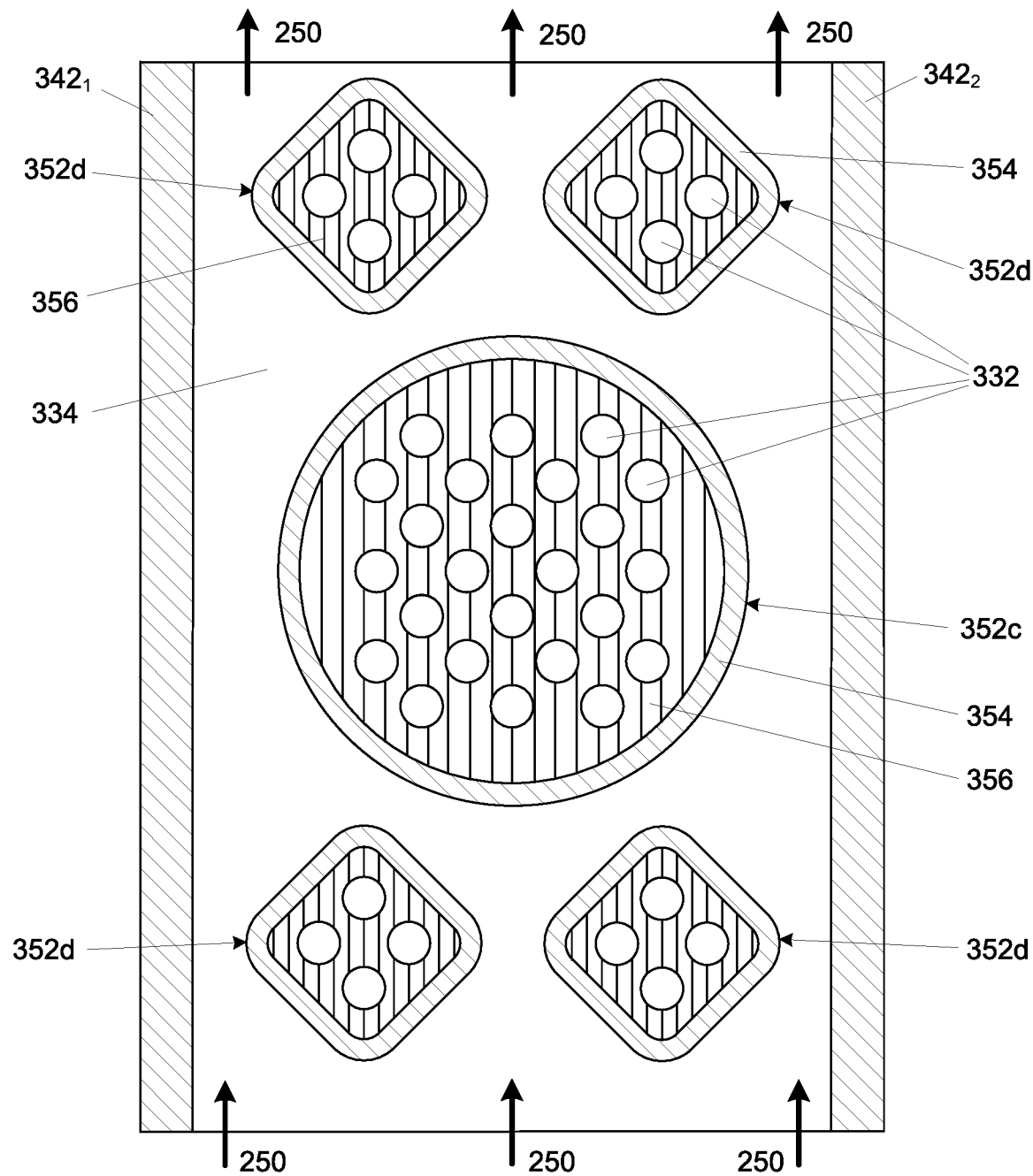

Although FIG. 21 illustrates the groupings 352 as substantially square with four interconnects 332 per interconnect grouping 352, it is understood that the interconnect grouping 352 may have any appropriate configuration for the interconnects 332. For example, as shown in FIG. 22, the interconnect groupings 352 may be at least one elongated rectangular structure. The interconnect groupings 352 may be substantially diamond shaped or portions thereof, as shown in FIG. 23. As shown in FIG. 24, a combination of different shaped interconnect groupings may be used, such as diamond shaped interconnect groupings 352d and circular interconnect groupings 352c. It is understood that the positions and shapes of the interconnect groupings 352, 352c, 352d may be determined based on the position(s) of hotspots and/or desired cooling profiles.

Figure 25:
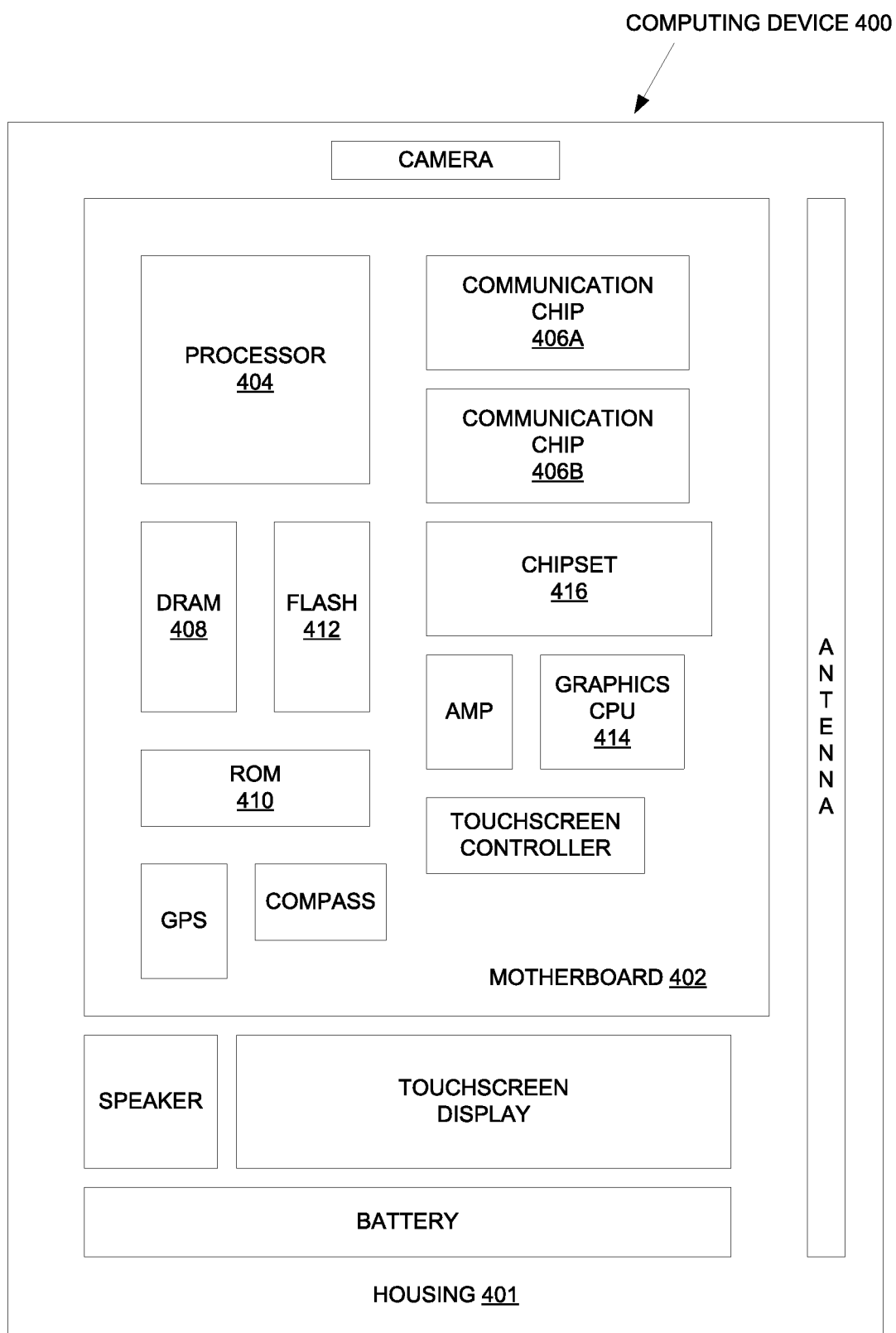
FIG. 25 is a schematic of an electronic device/system, according to an embodiment of the present description.

FIG. 25 illustrates an electronic or computing device 400 in accordance with one implementation of the present description. The computing device 400 may include a housing 401 having a board 402 disposed therein. The board 402 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising a substrate, a first integrated circuit device electrically attached to the substrate, a second integrated circuit device electrically attached to the first integrated circuit device, and a heat dissipation device defining a fluid chamber, wherein at least a portion of the first integrated circuit device and at least a portion of the second integrated circuit device are exposed to the fluid chamber. The integrated circuit assembly may further include at least one channel formed in an underfill material between the first integrated circuit device and the second integrated circuit device, between the first integrated circuit device and the substrate, and/or between the second integrated circuit device and the substrate, wherein the at least one channel is open to the fluid chamber.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-25. The subject matter may be applied to other integrated circuit devices and assembly applications, as well as any appropriate electronic application, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
a substrate having a first surface;
an integrated circuit device having a first surface;
a plurality of interconnects extending between the first surface of the integrated circuit device and the first surface of a substrate;
a first grouping comprising a first portion of the plurality of interconnects and a sealing structure surrounding the first portion of the plurality of interconnections, wherein the sealing structure of the first grouping provides an electrical connection between the integrated circuit device and the substrate;
a second grouping comprising a second portion of the plurality of interconnects and a sealing structure surrounding the second portion of the plurality of interconnects; and
at least one fluid transport channel between the first surface of the integrated circuit device and the first surface of the substrate, wherein at least a portion of the at least one fluid transport channel is defined by the first surface of the integrated circuit device, the first surface of the substrate, the sealing structure of the first grouping, and the sealing structure of the second grouping.

2. The apparatus of claim 1, further comprising an underfill material disposed between the interconnects of the first grouping and the sealing structure of the first grouping.

3. The apparatus of claim 2, further comprising an underfill material disposed between the interconnects of the second grouping and the sealing structure of the second grouping.

4. The apparatus of claim 1, wherein at least one interconnect of the plurality of interconnects forms an electrical connection between the integrated circuit device and the substrate.

5. The apparatus of claim 1, wherein the sealing structure of the second grouping forms an electrical connection between the integrated circuit device and the substrate.

6. The apparatus of claim 1, further including a coating layer in the at least one channel, wherein the coating layer abuts the substrate.

7. The apparatus of claim 1, wherein at least another portion of the at least one channel is defined by two opposing side walls extending between the first surface of the integrated circuit device and the first surface of the substrate.

8. The apparatus of claim 7, wherein the first grouping and the second grouping are between the two opposing side walls.

9. The apparatus of claim 1, further comprising a heat transfer fluid within the at least one channel.

10. An apparatus, comprising:
a first integrated circuit device having a first surface;
a second integrated circuit device having a first surface;
a plurality of interconnects extending between the first integrated circuit device and the second integrated circuit device;
a first grouping comprising a first portion of the plurality of interconnects and a sealing structure surrounding the first portion of the plurality of interconnections, wherein the sealing structure of the first grouping provides an electrical connection between the first and second integrated circuit devices;
a second grouping comprising a second portion of the plurality of interconnects and a sealing structure surrounding the second portion of the plurality of interconnects; and
at least one fluid transport channel between the first surface of the first integrated circuit device and the first surface of the second integrated circuit device, wherein at least a portion of the at least one fluid transport channel is defined by the first integrated circuit device, the second integrated circuit device, the sealing structure of the first grouping, and the sealing structure of the second grouping.

11. The apparatus of claim 10, further comprising an underfill material disposed between the interconnects of the first grouping and the sealing structure of the first grouping.

12. The apparatus of claim 11, further comprising an underfill material disposed between the interconnects of the second grouping and the sealing structure of the second grouping.

13. The apparatus of claim 10, wherein at least one interconnect of the plurality of interconnects forms an electrical connection between the first integrated circuit device and the second integrated circuit device.

14. The apparatus of claim 10, wherein the sealing structure of the second grouping forms an electrical connection between the first integrated circuit device and the second integrated circuit device.

15. The apparatus of claim 10, wherein at least another portion of the at least one channel is defined by two opposing side walls extending between the first integrated circuit device and the second integrated circuit device.

16. The apparatus of claim 15, wherein the first grouping and the second grouping are disposed between the two opposing side walls.

17. The apparatus of claim 10, further comprising a heat transfer fluid within the at least one channel.

\* \* \* \* \*